United States Patent
Brophy et al.

(10) Patent No.: US 12,271,164 B2
(45) Date of Patent: Apr. 8, 2025

(54) MODULAR CONTROLLER FOR A BUILDING MANAGEMENT SYSTEM

(71) Applicant: Johnson Controls Tyco IP Holdings LLP, Milwaukee, WI (US)

(72) Inventors: Christopher Brophy, Cedarburg, WI (US); Daniel Disch, Brookfield, WI (US); Kim Weller, Mukwonago, WI (US); Julie Ahl, Milwaukee, WI (US); Nathan Emlen, Milwaukee, WI (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 492 days.

(21) Appl. No.: 17/677,684

(22) Filed: Feb. 22, 2022

(65) Prior Publication Data

US 2023/0266726 A1 Aug. 24, 2023

(51) Int. Cl.
*G05B 15/02* (2006.01)
*G06F 17/00* (2019.01)
*H05K 1/14* (2006.01)
*H05K 5/02* (2006.01)
*H05K 7/14* (2006.01)

(52) U.S. Cl.
CPC ............ *G05B 15/02* (2013.01); *G06F 17/00* (2013.01); *H05K 1/14* (2013.01); *H05K 5/0256* (2013.01); *H05K 7/14* (2013.01); *H05K 7/1451* (2013.01); *H05K 7/1468* (2013.01); *H05K 7/1469* (2013.01); *H05K 7/1474* (2013.01)

(58) Field of Classification Search
None
See application file for complete search history.

(56) References Cited

U.S. PATENT DOCUMENTS

| | | | |
|---|---|---|---|
| 9,901,511 B2 | 2/2018 | Kang et al. | |
| 2004/0059814 A1 | 3/2004 | Komiya et al. | |
| 2006/0207730 A1 | 9/2006 | Berman et al. | |
| 2009/0083517 A1 | 3/2009 | Riddle | |
| 2012/0043830 A1* | 2/2012 | Wehrle | H05K 7/1484 307/139 |
| 2015/0063473 A1 | 3/2015 | Nishibayashi et al. | |
| 2015/0347161 A1* | 12/2015 | Kretschmann | H05K 7/1474 710/8 |
| 2017/0131610 A1 | 5/2017 | Brown et al. | |

(Continued)

OTHER PUBLICATIONS

Freewave, "I/O Expansion User Manual and Reference Guide", Mar. 2012, FreeWave Technologies, pp. 1, 3, 17 (Year: 2012).*

(Continued)

*Primary Examiner* — David Earl Ogg
(74) *Attorney, Agent, or Firm* — Foley & Lardner LLP

(57) ABSTRACT

A device for use in a building management system (BMS) is a controller device. The device includes a base comprising a first processor and a base interface, the first processor being configure to provide control operations for a device in the building system, and a first module installable on and removable from the base. The first module includes a first module interface for receiving power from and communicating with the base via the base interface. In some embodiments, the device includes an optional a second module installable on and removable from the base, the second module comprising a second module interface for receiving power from and communicating with the base via the base interface.

20 Claims, 14 Drawing Sheets

(56) References Cited

U.S. PATENT DOCUMENTS

| | | |
|---|---|---|
| 2018/0101157 A1 | 4/2018 | Amundson et al. |
| 2019/0104633 A1* | 4/2019 | Ross .................... H05K 7/1468 |
| 2019/0310595 A1* | 10/2019 | Martin ................ H04L 12/2803 |
| 2019/0361412 A1 | 11/2019 | Park et al. |
| 2020/0228621 A1 | 7/2020 | Gamroth et al. |
| 2020/0409883 A1* | 12/2020 | Dixit ..................... G06F 13/382 |
| 2021/0182228 A1 | 6/2021 | Dixit et al. |
| 2022/0090805 A1 | 3/2022 | Vitullo et al. |
| 2023/0118452 A1* | 4/2023 | Takagi ............... G05B 19/0423 |
| | | 341/155 |

OTHER PUBLICATIONS

Phoenix, "Radioline—900 MHz wireless transmission system for serial interfaces and I/O signals", Jul. 2018, Phoenix Contact, pp. 9-11, 16-17 (Year: 2018).*

Polycase, "What Is a DIN Rail? Basics and Different Types", Nov. 2020, pp. 3-4 (Year: 2020).*

* cited by examiner

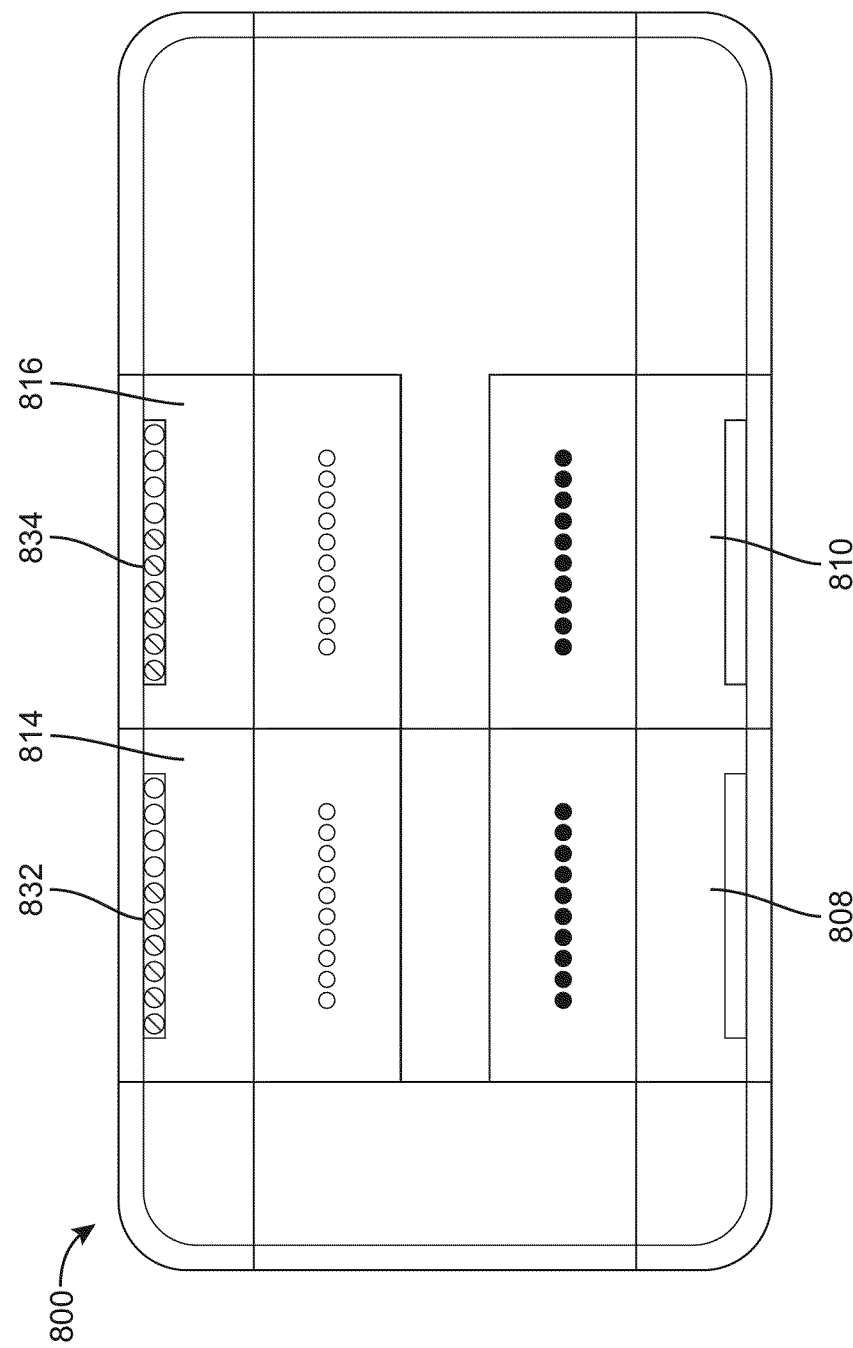

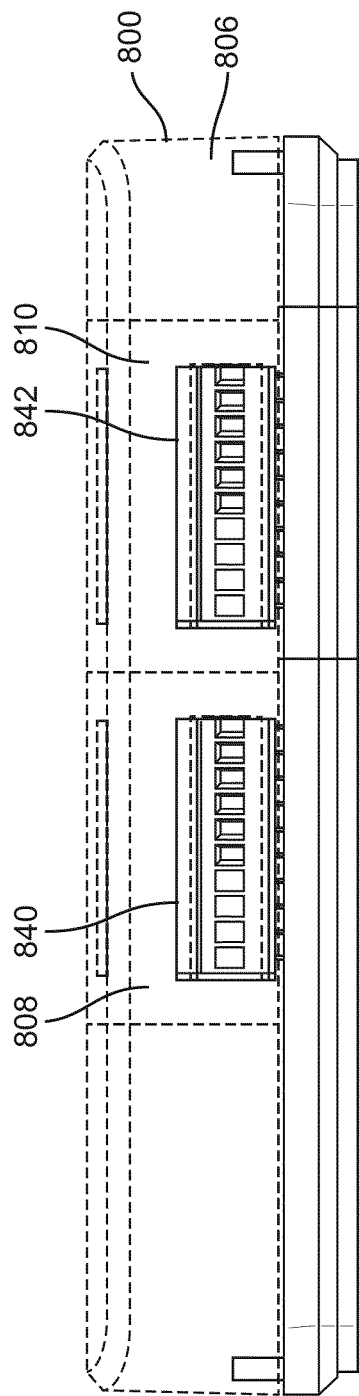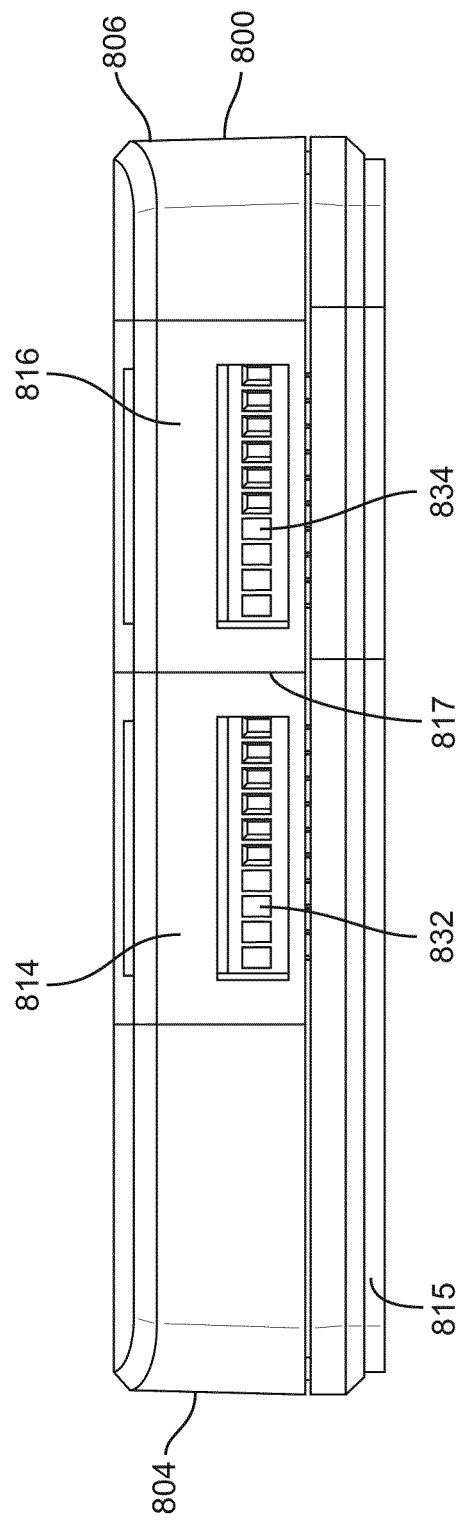

Selection Charts

IOM Series Point Type Counts per Model

| Point Types | Signals Accepted | IOM17 | IOM27 | IOM37 | IOM47 |
|---|---|---|---|---|---|
| Universal Input (UI) | Analog Input, Voltage Mode, 0 - 10 VDC<br>Analog Input, Current Mode, 4 - 20 mA<br>Analog Input, Resistive Mode, 0 - 2k ohm, RTD (1k Ni [Johnson Controls], 1k PT, A99B Si), NTC (10k Type L, 2.252k Type 2)<br>Binary Input, Dry Contact Maintained Mode | 0 | 2 | 4 | 6 |
| Binary Input (BI) | Dry Contact Maintained Mode<br>Pulse Counter Mode (High Speed), 100 Hz | 4 | 0 | 0 | 2 |
| Analog Output (AO) | Analog Output, Voltage Mode, 0 - 10 VDC<br>Analog Output, Current Mode, 4 - 20 mA | 0 | 0 | 0 | 2 |
| Binary Output (BO) | 24 VAC Triac | 0 | 2 | 4 | 3 |
| Universal Output (UO) | Analog Output, Voltage Mode, 0 - 10 VDC<br>Binary Output Mode; 24 V AC/DC FET<br>Analog Output, Current Mode, 4 - 20 mA | 0 | 0 | 0 | 0 |
| Configurable Output (CO) | Analog Output, Voltage Mode, 0 - 10 VDC<br>Binary Output Mode, 24 VAC Triac | 0 | 2 | 0 | 4 |
| Relay Output | 120/240 VAC | 0 | 2 | 4 | 0 |

Ordering Information

| Code Number | Description |
|---|---|
| MS-IOM1711-0 | 4-Point IOM with 4 BI, FC Bus and SA Bus Support |
| MS-IOM2711-0 | 6-Point IOM with 2 UI, 2 UO, 2 BO, FC Bus, and SA Bus Support |
| MS-IOM3711-0 | 12-Point IOM with 4 UI, 4 UO, 4 BO, FC Bus, and SA Bus Support |
| MS-IOM4711-0 | 17-Point IOM with 6 UI, 2 BI, 3 BO, 2 AO, 4 CO, 24 VAC, and SA Bus with Mounting Base |

MODULAR CONTROLLER FOR A BUILDING MANAGEMENT SYSTEM

BACKGROUND

The present disclosure relates generally to the field of building management systems and controllers for such systems. A building management system (BMS) is, in general, a system of devices configured to control, monitor, and/or manage equipment in or around a building, buildings, or building area. A BMS can be or include, for example, an HVAC system, a security system, a lighting system, a fire alerting system, any other system that is capable of managing building functions or devices, and/or any combination thereof.

Some equipment that operates as part of a BMS may require different types of input/output (I/O) interfaces. For example, field controllers and input output modules (IOMs) in a BMS often have fixed point counts and types (i.e. eight binary inputs) that may not be needed depending on system configuration or applications. The provision of the fixed points on the controller or IOM adds to the cost of the controller or IOM. In addition, adding I/O interfaces for a particular application may require purchasing a different field controller or IOM to obtain to the right fixed point count, type and/or mix of count and type for the application. The additional controllers or IOMs add redundant circuitry including a power supply and communication interfaces for the system. It would generally be desirable to provide a more flexible, lower-cost option for providing the appropriate number and type of fixed points.

SUMMARY

One implementation of the present disclosure is a controller device in a building system. The device includes a base comprising a first processor and a base interface, the first processor being configure to provide control operations for a device in the building system, and a first module installable on and removable from the base. The first module includes a first module interface for receiving power from and communicating with the base via the base interface. In some embodiments, the device includes an optional a second module installable on and removable from the base, the second module comprising a second module interface for receiving power from and communicating with the base via the base interface.

Some embodiments relate to a building system. The building system includes equipment that affects or senses an environment within a building, and a controller device. The controller device includes a base including a first processor and a base interface. The first processor is configured to provide control operations for a device in the building system. The controller device also includes a first module installable on and removable from the base, the first module comprising a second processor and a first module interface for receiving power from and communicating with the base via the base interface, wherein the first processor queries an address from the second processor of the first module at power up.

Some embodiments relate to a method for monitoring or controlling a device in a building management system (BMS). The method includes providing a base comprising a first processor and a wireless base interface, the first processor being configure to provide control operations for a device in the building system. The method also includes installing a first module installable on the base, the first module comprising a terminal block and a first wireless module interface for receiving power from and communicating with the base via the wireless base interface and coupling the device to the terminal block.

Another implementation of the present disclosure is a BMS. The BMS includes equipment that affects an environment within a building and a device for monitoring and controlling the equipment. The device includes a base hardware component that provides communication between the equipment and a first network associated with the BMS. The base hardware component includes a processor and a memory. The device further includes a modular hardware component connected to the base hardware component and a modular software component stored in the memory that recognizes the modular hardware component connected to the base hardware component and provides communication between the equipment and a second network using the modular hardware component. The processor executes a control application to control operation of the equipment and the environment within the building based in part on data received from the equipment and data received from at least one of the first network and the second network.

Yet another implementation of the present disclosure is a method for controlling a device in a BMS. The method includes providing a base hardware component that facilitates communication between the device and a network associated with the BMS. The base hardware component includes a processor and a memory. The method further includes connecting a modular hardware component to the base hardware component and providing a modular software component stored in the memory that recognizes the modular hardware component connected to the base hardware component and provides communication between the device and a second network using the modular hardware component.

Some embodiments relate to a controller device in a building system. The device includes a base including a first processor and a base interface. The first processor is configured to provide control operations for a device in the building system. The base interface is configured to receive a plug-in module and includes a power and communication interface for providing power to and communicating with the plug-in module.

The term controller as used herein is intended to include IOMs.

BRIEF DESCRIPTION OF THE DRAWINGS

FIG. 9 is a planar top view schematic drawing of the exemplary controller system illustrated in FIG. 8, according to some embodiments.

FIG. 10 is planar side view schematic drawing of the exemplary controller system illustrated in FIG. 8, according to some embodiments.

FIG. 11 is planar side view schematic drawing of the exemplary controller system illustrated in FIG. 8, according to some embodiments.

FIG. 15 is a table showing IOM configurations for the exemplary controller illustrated in FIG. 8, according to some embodiments.

DETAILED DESCRIPTION

Overview

Referring generally to the FIGURES, a modular input/output (I/O) interface architecture and associated controllers and IOMs is shown, according to some embodiments. In some embodiments, the modularity advantageously reduces the number of different types of controllers and IOMs required by a BMS and allows for flexibility of configuring and commissioning site-specific I/O based on needs, thereby efficiently using time and reducing waste at the factory and in the field. The modular architecture allows for controllers and IOMs to be equipped for a particular BMS or HAVC system without requiring overly expensive hardware and/or software in some embodiments.

In some embodiments, the IOMs or controllers include a base hardware component with a processor, a memory, power supply, and one or more modular components (e.g., wireless communication interfaces (e.g., Wi-Fi, Bluetooth, near filed communication (NFC)), binary interface, serial ports, RS485, and a BACnet interface. In some embodiments, a modular I/O solution with integral terminal blocks or modules allows dynamic factory and field configuration of point counts and types. In some embodiments, the modules are hot-pluggable/swappable and are automatically identified/addressed by the main processor (e.g., a "multi-master" with address arbitration; alternatively, manually addressed via a switch or near field communication (NFC)). In addition, a processor module can be provided and is replaceable for future upgradeability. Wireless commissioning (i.e. Wi-Fi, Bluetooth, NFC, etc. or any combination) is modularized, either at each terminal module and/or as a discrete pluggable module that can be connected to the mainboard/backplane in some embodiments. The terminal block supporting one of wireless communication interfaces, binary interfaces, serial ports and a BACnet interface can be plugged into a universal port or slot and appear as being integrated with the base hardware component housing in some embodiments. In some embodiments, each module includes a user indication of status through an embedded display and/or RGB LED indicators at each module and/or terminal position. Indications are used for fault and/or I/O status (i.e. wiring fault, out-of-range input, active output, etc.) in some embodiments. Each module is self-encapsulated for environmental protection and safe handling in the field, and the mainboard-to-module connections can be keyed (disallowed in certain positions) and/or physically secured for a robust design in some embodiments.

Building Management System and HVAC System

Figure 1:
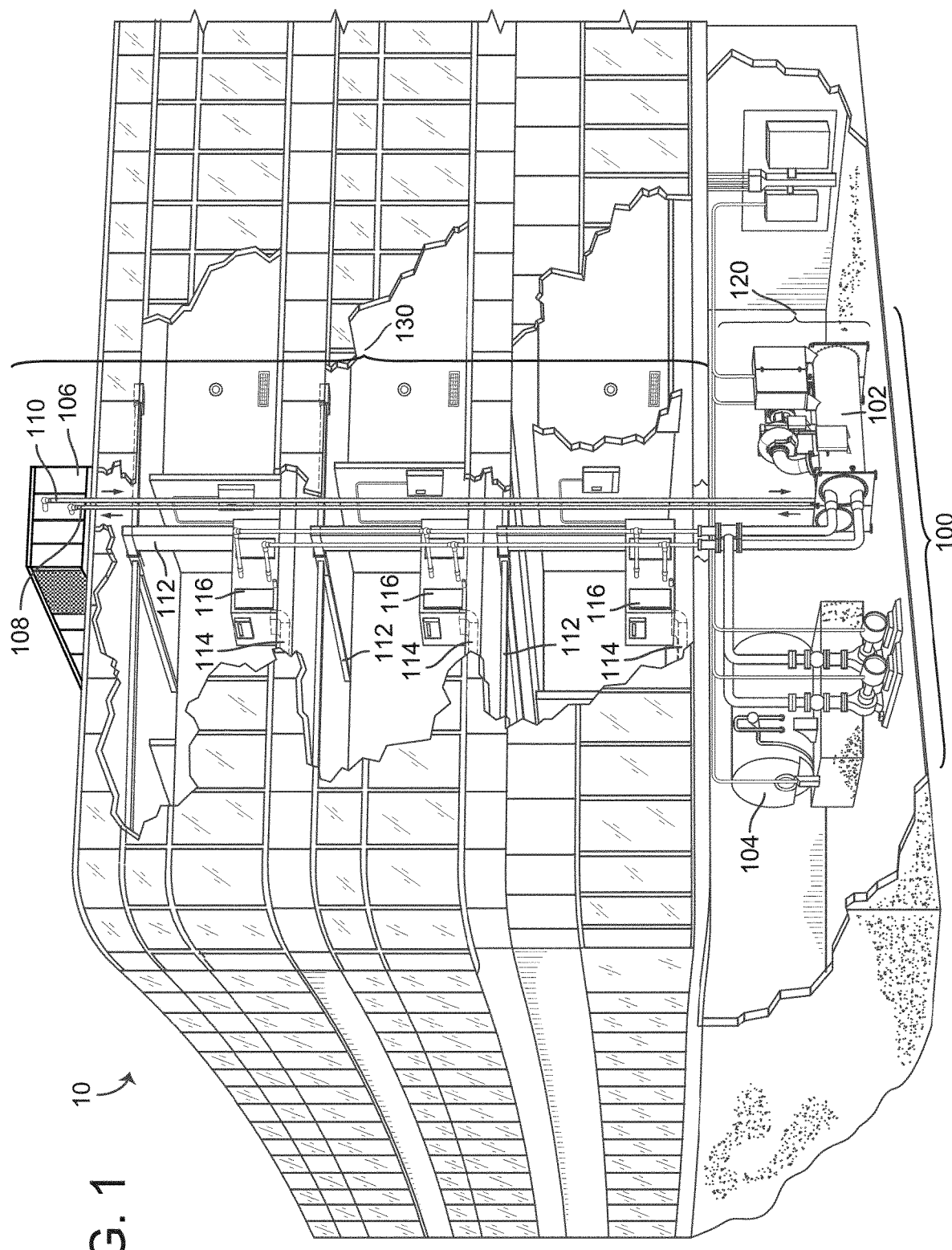
FIG. 1 is a drawing of a building equipped with a building management system (BMS) and a HVAC system, according to some embodiments.

Referring now to FIGS. 1-4, an example building management system (BMS) and HVAC system in which the systems and methods of the present disclosure can be implemented are shown, according to an example embodiment. Referring particularly to FIG. 1, a perspective view of a building 10 is shown. Building 10 is served by a BMS. A BMS is, in general, a system of devices configured to control, monitor, and manage equipment in or around a building or building area. A BMS can include, for example, a HVAC system, a security system, a lighting system, and a fire alerting system, any other system that is capable of managing building functions or devices, or any combination thereof.

The BMS that serves building 10 includes an HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 can provide a heated or chilled fluid to an air handling unit of airside system 130. Airside system 130 can use the heated or chilled fluid to heat or cool an airflow provided to building 10. An example waterside system and airside system which can be used in HVAC system 100 are described in greater detail with reference to FIGS. 2 and 3.

HVAC system 100 is shown to include a chiller 102, a boiler 104, and a rooftop air handling unit (AHU) 106. Waterside system 120 can use boiler 104 and chiller 102 to heat or cool a working fluid (e.g., water, glycol, etc.) and can circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 can add heat to the circulated fluid, for example, by burning a combustible material (e.g., natural gas) or using an electric heating element. Chiller 102 can place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 can place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 can transfer heat between the airflow and the working fluid to provide heating or cooling for the airflow. For example, AHU 106 can include one or more fans or blowers configured to pass the airflow over or through a heat exchanger containing the working fluid. The working fluid can then return to chiller 102 or boiler 104 via piping 110.

Airside system 130 can deliver the airflow supplied by AHU 106 (i.e., the supply airflow) to building 10 via air supply ducts 112 and can provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 can receive input from sensors located within AHU 106 and/or within the building zone and can adjust the flow rate, temperature, or other attributes of the supply airflow through AHU 106 to achieve setpoint conditions for the building zone.

Figure 2:
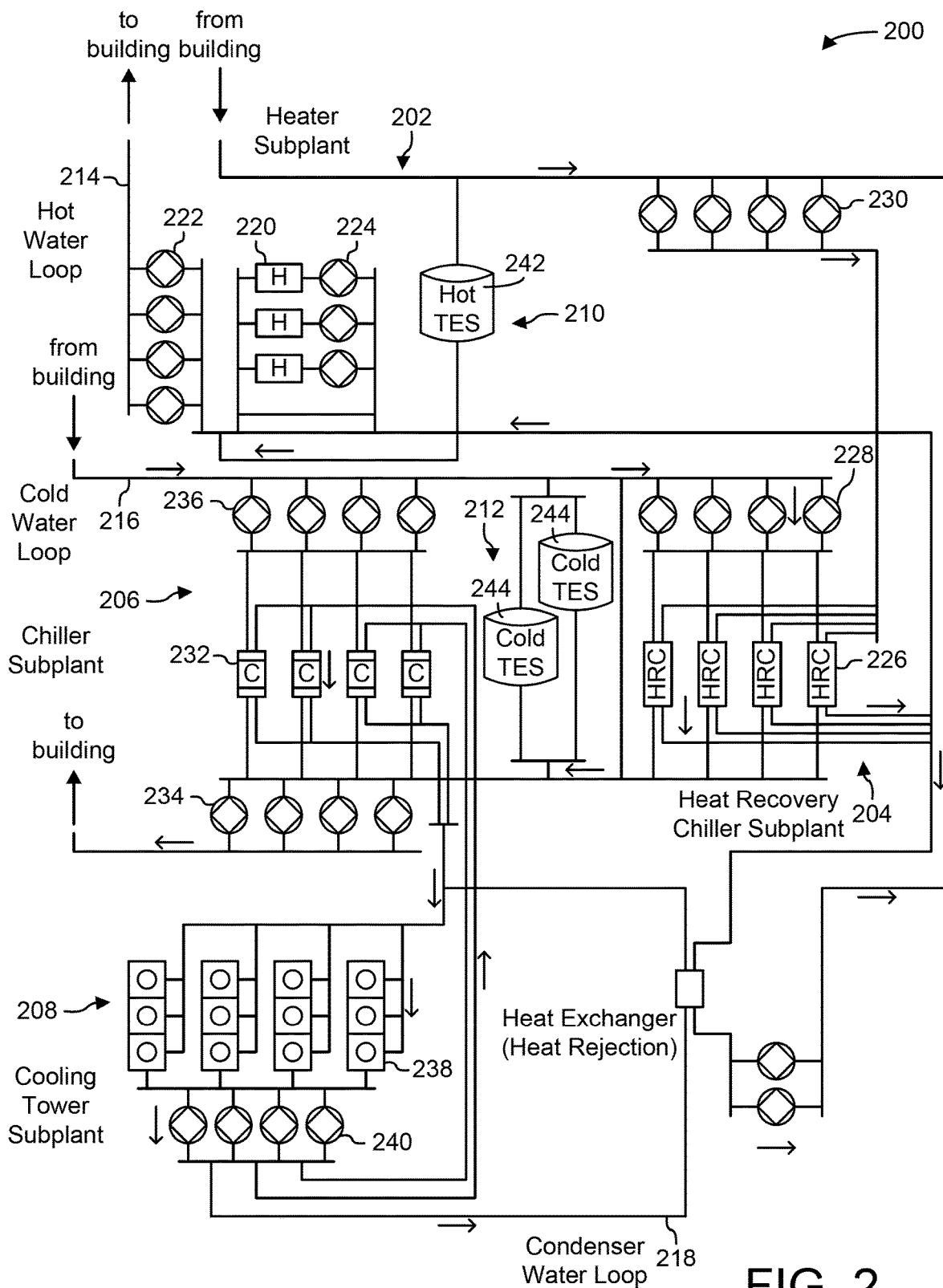
FIG. 2 is a schematic of a waterside system which can be used as part of the HVAC system of FIG. 1, according to some embodiments.

Referring now to FIG. 2, a block diagram of a waterside system 200 is shown, according to an example embodiment. In various embodiments, waterside system 200 can supplement or replace waterside system 120 in HVAC system 100 or can be implemented separate from HVAC system 100. When implemented in HVAC system 100, waterside system 200 can include a subset of the HVAC devices in HVAC system 100 (e.g., boiler 104, chiller 102, pumps, valves, etc.) and can operate to supply a heated or chilled fluid to AHU 106. The HVAC devices of waterside system 200 can be located within building 10 (e.g., as components of waterside system 120) or at an offsite location such as a central plant.

In FIG. 2, waterside system 200 is shown as a central plant having a plurality of subplants 202-212. Subplants 202-212 are shown to include a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources (e.g., water, natural gas, electricity, etc.) from utilities to serve the thermal energy loads (e.g., hot water, cold water, heating, cooling, etc.) of a building or campus. For example, heater subplant 202 can be configured to heat water in a hot water loop 214 that circulates the hot water between heater subplant 202 and building 10. Chiller subplant 206 can be configured to chill water in a cold water loop 216 that circulates the cold water between chiller subplant 206 and building 10. Heat recovery chiller subplant 204 can be configured to transfer heat from cold water loop 216 to hot water loop 214 to provide additional heating for the hot water and additional cooling for the cold water. Condenser water loop 218 can absorb heat from the cold water in chiller subplant 206 and reject the absorbed heat in cooling tower subplant 208 or transfer the absorbed heat to hot water loop 214. Hot TES subplant 210 and cold TES subplant 212 can store hot and cold thermal energy, respectively, for subsequent use.

Hot water loop 214 and cold water loop 216 can deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air can be delivered to individual zones of building 10 to serve the thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, $CO_2$, etc.) can be used in place of or in addition to water to serve the thermal energy loads. In other embodiments, subplants 202-212 can provide heating and/or cooling directly to the building or campus without requiring an intermediate heat transfer fluid. These and other variations to waterside system 200 are within the teachings of the present invention.

Each of subplants 202-212 can include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 can also include one or more pumps or valves configured to control the flow rate of the hot water into or out of hot TES tank 242. Cold TES subplant 212 is shown to include cold TES tanks 244 configured to store the cold water for later use. Cold TES subplant 212 can also include one or more pumps or valves configured to control the flow rate of the cold water into or out of cold TES tanks 244.

In some embodiments, one or more of the pumps in waterside system 200 (e.g., pumps 222, 224, 228, 230, 234, 236, and/or 240) or pipelines in waterside system 200 include an isolation valve associated therewith. Isolation valves can be integrated with the pumps or positioned upstream or downstream of the pumps to control the fluid flows in waterside system 200. In various embodiments, waterside system 200 can include more, fewer, or different types of devices and/or subplants based on the particular configuration of waterside system 200 and the types of loads served by waterside system 200.

Figure 3:
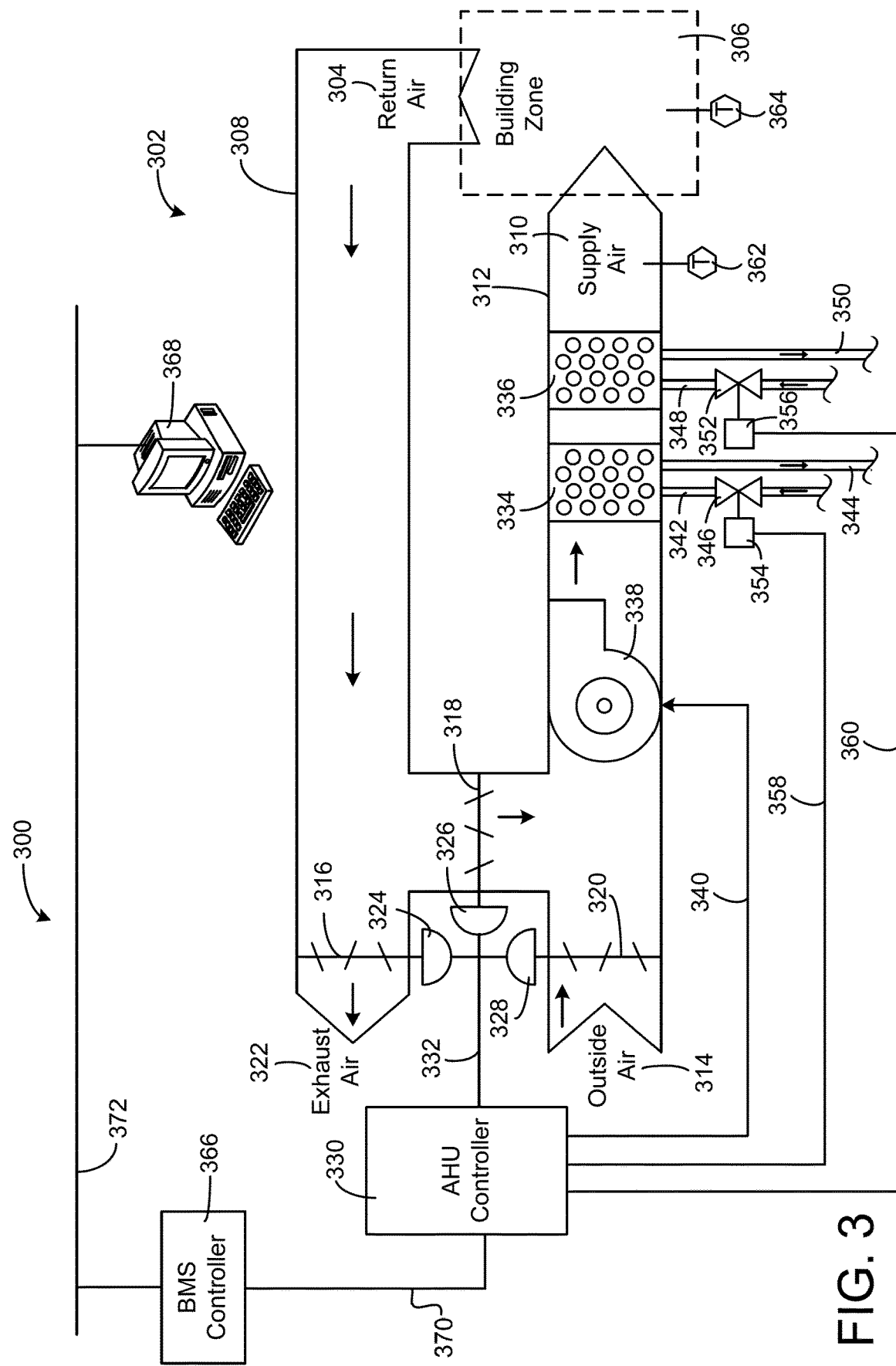
FIG. 3 is a block diagram of an airside system which can be used as part of the HVAC system of FIG. 1, according to some embodiments.

Referring now to FIG. 3, a block diagram of an airside system 300 is shown, according to an example embodiment. In various embodiments, airside system 300 can supplement or replace airside system 130 in HVAC system 100 or can be implemented separate from HVAC system 100. When implemented in HVAC system 100, airside system 300 can include a subset of the HVAC devices in HVAC system 100 (e.g., AHU 106, VAV units 116, duct 112, duct 114, fans, dampers, etc.) and can be located in or around building 10. Airside system 300 can operate to heat or cool an airflow provided to building 10 using a heated or chilled fluid provided by waterside system 200.

In FIG. 3, airside system 300 is shown to include an economizer-type air handling unit (AHU) 302. Economizer-type AHUs vary the amount of outside air and return air used by the air handling unit for heating or cooling. For example, AHU 302 can receive return air 304 from building zone 306 via return air duct 308 and can deliver supply air 310 to building zone 306 via supply air duct 312. In some embodiments, AHU 302 is a rooftop unit located on the roof of building 10 (e.g., AHU 106 as shown in FIG. 1) or otherwise positioned to receive both return air 304 and outside air 314. AHU 302 can be configured to operate exhaust air damper 316, mixing damper 318, and outside air damper 320 to control an amount of outside air 314 and return air 304 that combine to form supply air 310. Any return air 304 that does not pass through mixing damper 318 can be exhausted from AHU 302 through exhaust damper 316 as exhaust air 322.

Each of dampers 316-320 can be operated by an actuator. For example, exhaust air damper 316 can be operated by actuator 324, mixing damper 318 can be operated by actuator 326, and outside air damper 320 can be operated by actuator 328. Actuators 324-328 can communicate with an AHU controller 330 via a communications link 332. Actuators 324-328 can receive control signals from AHU controller 330 and can provide feedback signals to AHU controller 330. Feedback signals can include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that can be collected, stored, or used by actuators 324-328. AHU controller 330 can be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 can be configured to force supply air 310 through cooling coil 334 and/or heating coil 336 and provide supply air 310 to building zone 306. AHU controller 330 can communicate with fan 338 via communications link 340 to control a flow rate of supply air 310. In some embodiments, AHU controller 330 controls an amount of heating or cooling applied to supply air 310 by modulating a speed of fan 338.

Cooling coil 334 can receive a chilled fluid from waterside system 200 (e.g., from cold water loop 216) via piping 342 and can return the chilled fluid to waterside system 200 via piping 344. Valve 346 can be positioned along piping 342 or piping 344 to control a flow rate of the chilled fluid through cooling coil 334. In some embodiments, cooling coil 334 includes multiple stages of cooling coils that can be independently activated and deactivated (e.g., by AHU controller 330, by BMS controller 366, etc.) to modulate an amount of cooling applied to supply air 310.

Heating coil 336 can receive a heated fluid from waterside system 200 (e.g., from hot water loop 214) via piping 348 and can return the heated fluid to waterside system 200 via piping 350. Valve 352 can be positioned along piping 348 or piping 350 to control a flow rate of the heated fluid through heating coil 336. In some embodiments, heating coil 336 includes multiple stages of heating coils that can be independently activated and deactivated (e.g., by AHU controller 330, by BMS controller 366, etc.) to modulate an amount of heating applied to supply air 310.

Each of valves 346 and 352 can be controlled by an actuator. For example, valve 346 can be controlled by actuator 354 and valve 352 can be controlled by actuator 356. Actuators 354-356 can communicate with AHU controller 330 via communications links 358-360. Actuators 354-356 can receive control signals from AHU controller 330 and can provide feedback signals to controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 can also receive a measurement of the temperature of building zone 306 from a temperature sensor 364 located in building zone 306.

In some embodiments, AHU controller 330 operates valves 346 and 352 via actuators 354-356 to modulate an amount of heating or cooling provided to supply air 310 (e.g., to achieve a setpoint temperature for supply air 310 or to maintain the temperature of supply air 310 within a setpoint temperature range). The positions of valves 346 and 352 affect the amount of heating or cooling provided to supply air 310 by cooling coil 334 or heating coil 336 and may correlate with the amount of energy consumed to achieve a desired supply air temperature. AHU controller 330 can control the temperature of supply air 310 and/or building zone 306 by activating or deactivating coils 334-336, adjusting a speed of fan 338, or a combination of both.

Still referring to FIG. 3, airside system 300 is shown to include a building management system (BMS) controller 366 and a client device 368. BMS controller 366 can include one or more computer systems (e.g., servers, supervisory controllers, subsystem controllers, etc.) that serve as system level controllers, application or data servers, head nodes, or master controllers for airside system 300, waterside system 200, HVAC system 100, and/or other controllable systems that serve building 10. BMS controller 366 can communicate with multiple downstream building systems or subsystems (e.g., HVAC system 100, a security system, a lighting system, waterside system 200, etc.) via a communications link 370 according to like or disparate protocols (e.g., LON, BACnet, etc.). In various embodiments, AHU controller 330 and BMS controller 366 can be separate (as shown in FIG. 3) or integrated. In an integrated implementation, AHU controller 330 can be a software module configured for execution by a processor of BMS controller 366.

In some embodiments, AHU controller 330 receives information from BMS controller 366 (e.g., commands, setpoints, operating boundaries, etc.) and provides information to BMS controller 366 (e.g., temperature measurements, valve or actuator positions, operating statuses, diagnostics, etc.). For example, AHU controller 330 can provide BMS controller 366 with temperature measurements from temperature sensors 362 and 364, equipment on/off states, equipment operating capacities, and/or any other information that can be used by BMS controller 366 to monitor or control a variable state or condition within building zone 306.

Client device 368 can include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 can be a computer workstation, a client terminal, a remote or local interface, or any other type of user interface device. Client device 368 can be a stationary terminal or a mobile device. For example, client device 368 can be a desktop computer, a computer server with a user interface, a laptop computer, a tablet, a smartphone, a PDA, or any other type of mobile or non-mobile device. Client device 368 can communicate with BMS controller 366 and/or AHU controller 330 via communications link 372.

Figure 4:
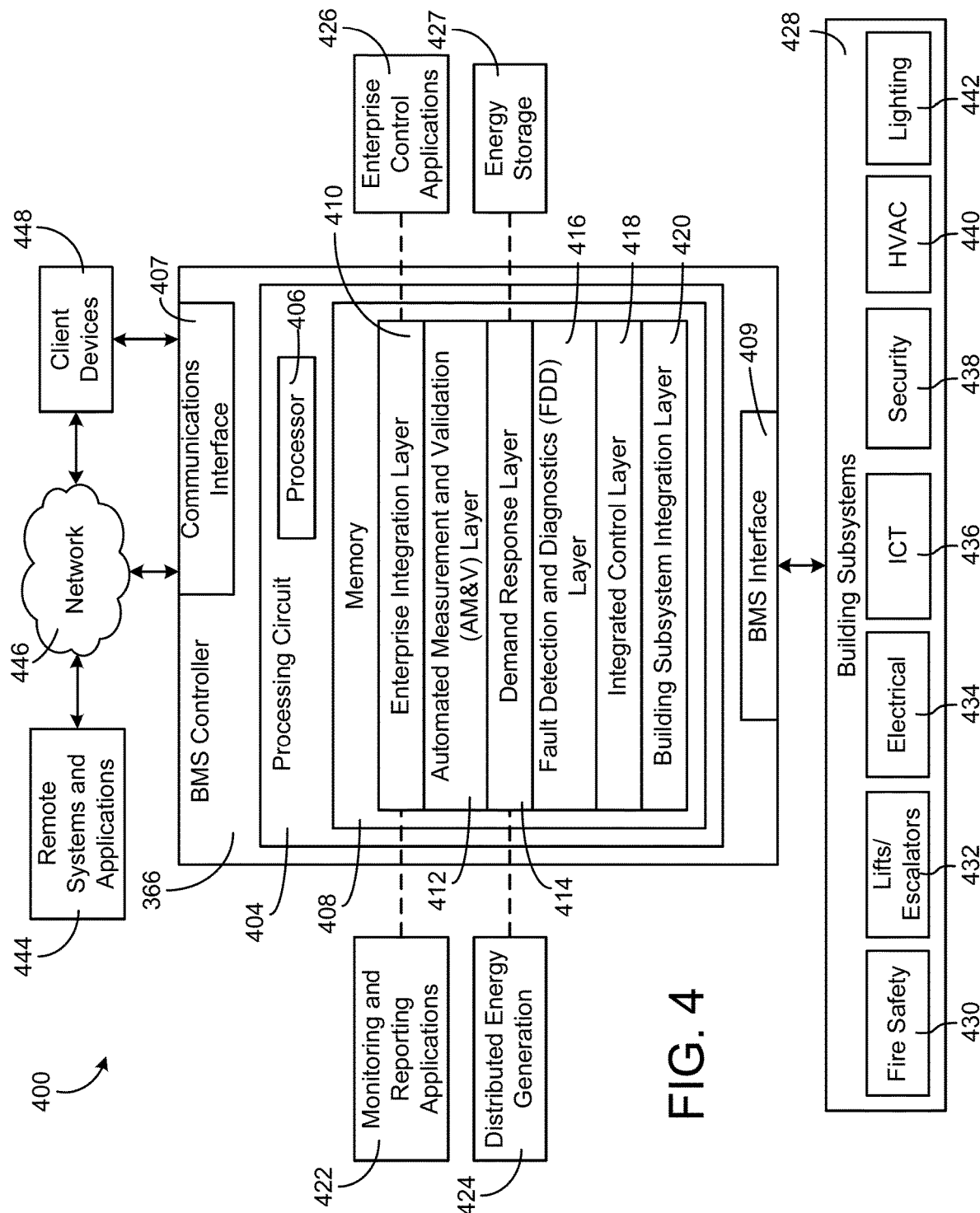
FIG. 4 is a block diagram of a BMS which can be used in the building of FIG. 1, according to some embodiments.

Referring now to FIG. 4, a block diagram of a building management system (BMS) 400 is shown, according to an example embodiment. BMS 400 can be implemented in building 10 to automatically monitor and control various building functions. BMS 400 is shown to include BMS controller 366 and a plurality of building subsystems 428. Building subsystems 428 are shown to include a building electrical subsystem 434, an information communication technology (ICT) subsystem 436, a security subsystem 438, a HVAC subsystem 440, a lighting subsystem 442, a lift/escalators subsystem 432, and a fire safety subsystem 430. In various embodiments, building subsystems 428 can include fewer, additional, or alternative subsystems. For example, building subsystems 428 can also or alternatively include a refrigeration subsystem, an advertising or signage subsystem, a cooking subsystem, a vending subsystem, a printer or copy service subsystem, or any other type of building subsystem that uses controllable equipment and/or sensors to monitor or control building 10. In some embodiments, building subsystems 428 include waterside system 200 and/or airside system 300, as described with reference to FIGS. 2 and 3.

Each of building subsystems 428 can include any number of devices, controllers, and connections for completing its individual functions and control activities. HVAC subsystem 440 can include many of the same components as HVAC system 100, as described with reference to FIGS. 1-3. For example, HVAC subsystem 440 can include a chiller, a boiler, any number of air handling units, economizers, field controllers, supervisory controllers, actuators, temperature sensors, and other devices for controlling the temperature, humidity, airflow, or other variable conditions within building 10. Lighting subsystem 442 can include any number of light fixtures, ballasts, lighting sensors, dimmers, or other devices configured to controllably adjust the amount of light provided to a building space. Security subsystem 438 can include occupancy sensors, video surveillance cameras, digital video recorders, video processing servers, intrusion detection devices, access control devices (e.g., card access, etc.) and servers, or other security-related devices.

Still referring to FIG. 4, BMS controller 366 is shown to include a communications interface 407 and a BMS interface 409. Interface 407 can facilitate communications between BMS controller 366 and external applications (e.g., monitoring and reporting applications 422, enterprise control applications 426, remote systems and applications 444, applications residing on client devices 448, etc.) for allowing user control, monitoring, and adjustment to BMS controller 366 and/or subsystems 428. Interface 407 can also facilitate communications between BMS controller 366 and client devices 448. BMS interface 409 can facilitate communications between BMS controller 366 and building subsystems 428 (e.g., HVAC, lighting security, lifts, power distribution, business, etc.). In some embodiments, BMS controller 366 can be an IOM or controller such as a thermostat, an AHU controller, an IOM, a valve controller, an enterprise manager, a field controller, RTU controller, heat pump controller, chiller controller, boiler controller, VAV controller, a fan coil unit controller, a security controller, a lighting controllers, an edge controller, fire system controller, or other BMS control device and has a modular architecture as described herein.

Interfaces 407, 409 can be or include wired or wireless communications interfaces (e.g., jacks, antennas, transmitters, receivers, transceivers, wire terminals, etc.) for conducting data communications with building subsystems 428 or other external systems or devices. In various embodiments, communications via interfaces 407, 409 can be direct (e.g., local wired or wireless communications) or via a communications network 446 (e.g., a WAN, the Internet, a cellular network, etc.). For example, interfaces 407, 409 can include an Ethernet card and port for sending and receiving data via an Ethernet-based communications link or network. In another example, interfaces 407, 409 can include a Wi-Fi transceiver for communicating via a wireless communications network. In another example, one or both of interfaces 407, 409 can include cellular or mobile phone communications transceivers. In one embodiment, communications interface 407 is a power line communications interface and BMS interface 409 is an Ethernet interface. In other embodiments, both communications interface 407 and BMS interface 409 are Ethernet interfaces or are the same Ethernet interface.

Still referring to FIG. 4, BMS controller 366 is shown to include a processing circuit 404 including a processor 406 and memory 408. Processing circuit 404 can be communicably connected to BMS interface 409 and/or communications interface 407 such that processing circuit 404 and the various components thereof can send and receive data via interfaces 407, 409. Processor 406 can be implemented as a general purpose processor, an application specific integrated circuit (ASIC), one or more field programmable gate arrays (FPGAs), a group of processing components, or other suitable electronic processing components.

Memory 408 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 408 can be or include volatile memory or non-volatile memory. Memory 408 can include database components, object code components, script components, or any other type of information structure for supporting the various activities and information structures described in the present application. According to an example embodiment, memory 408 is communicably connected to processor 406 via processing circuit 404 and includes computer code for executing (e.g., by processing circuit 404 and/or processor 406) one or more processes described herein.

In some embodiments, BMS controller 366 is implemented within a single computer (e.g., one server, one housing, etc.). In various other embodiments BMS controller 366 can be distributed across multiple servers or computers (e.g., that can exist in distributed locations). Further, while FIG. 4 shows applications 422 and 426 as existing outside of BMS controller 366, in some embodiments, applications 422 and 426 can be hosted within BMS controller 366 (e.g., within memory 408).

Still referring to FIG. 4, memory 408 is shown to include an enterprise integration layer 410, an automated measurement and validation (AM&V) layer 412, a demand response (DR) layer 414, a fault detection and diagnostics (FDD) layer 416, an integrated control layer 418, and a building subsystem integration layer 420. Layers 410-420 can be configured to receive inputs from building subsystems 428 and other data sources, determine optimal control actions for building subsystems 428 based on the inputs, generate control signals based on the optimal control actions, and provide the generated control signals to building subsystems 428. The following paragraphs describe some of the general functions performed by each of layers 410-420 in BMS 400.

Enterprise integration layer 410 can be configured to serve clients or local applications with information and services to support a variety of enterprise-level applications. For example, enterprise control applications 426 can be configured to provide subsystem-spanning control to a graphical user interface (GUI) or to any number of enterprise-level business applications (e.g., accounting systems, user identification systems, etc.). Enterprise control applications 426 can also or alternatively be configured to provide configuration GUIs for configuring BMS controller 366. In yet other embodiments, enterprise control applications 426 can work with layers 410-420 to optimize building performance (e.g., efficiency, energy use, comfort, or safety) based on inputs received at interface 407 and/or BMS interface 409.

Building subsystem integration layer 420 can be configured to manage communications between BMS controller 366 and building subsystems 428. For example, building subsystem integration layer 420 can receive sensor data and input signals from building subsystems 428 and provide output data and control signals to building subsystems 428. Building subsystem integration layer 420 can also be configured to manage communications between building subsystems 428. Building subsystem integration layer 420 translate communications (e.g., sensor data, input signals, output signals, etc.) across a plurality of multi-vendor/multi-protocol systems.

Demand response layer 414 can be configured to optimize resource usage (e.g., electricity use, natural gas use, water use, etc.) and/or the monetary cost of such resource usage in response to satisfy the demand of building 10. The optimization can be based on time-of-use prices, curtailment signals, energy availability, or other data received from utility providers, distributed energy generation systems 424, from energy storage 427 (e.g., hot TES 242, cold TES 244, etc.), or from other sources. Demand response layer 414 can receive inputs from other layers of BMS controller 366 (e.g., building subsystem integration layer 420, integrated control layer 418, etc.). The inputs received from other layers can include environmental or sensor inputs such as temperature, carbon dioxide levels, relative humidity levels, air quality sensor outputs, occupancy sensor outputs, room schedules, and the like. The inputs can also include inputs such as electrical use (e.g., expressed in kWh), thermal load measurements, pricing information, projected pricing, smoothed pricing, curtailment signals from utilities, and the like.

According to an example embodiment, demand response layer 414 includes control logic for responding to the data and signals it receives. These responses can include communicating with the control algorithms in integrated control layer 418, changing control strategies, changing setpoints, or activating/deactivating building equipment or subsystems in a controlled manner. Demand response layer 414 can also include control logic configured to determine when to utilize stored energy. For example, demand response layer 414 can determine to begin using energy from energy storage 427 just prior to the beginning of a peak use hour.

In some embodiments, demand response layer 414 includes a control module configured to actively initiate control actions (e.g., automatically changing setpoints) which minimize energy costs based on one or more inputs representative of or based on demand (e.g., price, a curtailment signal, a demand level, etc.). In some embodiments, demand response layer 414 uses equipment models to determine an optimal set of control actions. The equipment models can include, for example, thermodynamic models describing the inputs, outputs, and/or functions performed by various sets of building equipment. Equipment models can represent collections of building equipment (e.g., subplants, chiller arrays, etc.) or individual devices (e.g., individual chillers, heaters, pumps, etc.).

Demand response layer 414 can further include or draw upon one or more demand response policy definitions (e.g., databases, XML, files, etc.). The policy definitions can be edited or adjusted by a user (e.g., via a graphical user interface) so that the control actions initiated in response to demand inputs can be tailored for the user's application, desired comfort level, particular building equipment, or based on other concerns. For example, the demand response policy definitions can specify which equipment can be turned on or off in response to particular demand inputs, how long a system or piece of equipment should be turned off, what setpoints can be changed, what the allowable set point adjustment range is, how long to hold a high demand setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.).

Integrated control layer 418 can be configured to use the data input or output of building subsystem integration layer 420 and/or demand response later 414 to make control decisions. Due to the subsystem integration provided by building subsystem integration layer 420, integrated control layer 418 can integrate control activities of the subsystems 428 such that the subsystems 428 behave as a single integrated super system. In an example embodiment, integrated control layer 418 includes control logic that uses inputs and outputs from a plurality of building subsystems to provide greater comfort and energy savings relative to the comfort and energy savings that separate subsystems could provide alone. For example, integrated control layer 418 can be configured to use an input from a first subsystem to make an energy-saving control decision for a second subsystem. Results of these decisions can be communicated back to building subsystem integration layer 420.

Integrated control layer 418 is shown to be logically below demand response layer 414. Integrated control layer 418 can be configured to enhance the effectiveness of demand response layer 414 by enabling building subsystems 428 and their respective control loops to be controlled in coordination with demand response layer 414. This configuration may advantageously reduce disruptive demand response behavior relative to conventional systems. For example, integrated control layer 418 can be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller.

Integrated control layer 418 can be configured to provide feedback to demand response layer 414 so that demand response layer 414 checks that constraints (e.g., temperature, lighting levels, etc.) are properly maintained even while demanded load shedding is in progress. The constraints can also include setpoint or sensed boundaries relating to safety, equipment operating limits and performance, comfort, fire codes, electrical codes, energy codes, and the like. Integrated control layer 418 is also logically below fault detection and diagnostics layer 416 and automated measurement and validation layer 412. Integrated control layer 418 can be configured to provide calculated inputs (e.g., aggregations) to these higher levels based on outputs from more than one building subsystem.

Automated measurement and validation (AM&V) layer 412 can be configured to verify that control strategies commanded by integrated control layer 418 or demand response layer 414 are working properly (e.g., using data aggregated by AM&V layer 412, integrated control layer 418, building subsystem integration layer 420, FDD layer 416, or otherwise). The calculations made by AM&V layer 412 can be based on building system energy models and/or equipment models for individual BMS devices or subsystems. For example, AM&V layer 412 can compare a model-predicted output with an actual output from building subsystems 428 to determine an accuracy of the model.

Fault detection and diagnostics (FDD) layer 416 can be configured to provide on-going fault detection for building subsystems 428, building subsystem devices (i.e., building equipment), and control algorithms used by demand response layer 414 and integrated control layer 418. FDD layer 416 can receive data inputs from integrated control layer 418, directly from one or more building subsystems or devices, or from another data source. FDD layer 416 can automatically diagnose and respond to detected faults. The responses to detected or diagnosed faults can include providing an alert message to a user, a maintenance scheduling system, or a control algorithm configured to attempt to repair the fault or to work-around the fault.

FDD layer 416 can be configured to output a specific identification of the faulty component or cause of the fault (e.g., loose damper linkage) using detailed subsystem inputs available at building subsystem integration layer 420. In other example embodiments, FDD layer 416 is configured to provide "fault" events to integrated control layer 418 which executes control strategies and policies in response to the received fault events. According to an example embodiment, FDD layer 416 (or a policy executed by an integrated control engine or business rules engine) can shut-down systems or direct control activities around faulty devices or systems to reduce energy waste, extend equipment life, or assure proper control response.

FDD layer 416 can be configured to store or access a variety of different system data stores (or data points for live data). FDD layer 416 can use some content of the data stores to identify faults at the equipment level (e.g., specific chiller, specific AHU, specific terminal unit, etc.) and other content to identify faults at component or subsystem levels. For example, building subsystems 428 can generate temporal (i.e., time-series) data indicating the performance of BMS 400 and the various components thereof. The data generated by building subsystems 428 can include measured or calculated values that exhibit statistical characteristics and provide information about how the corresponding system or process (e.g., a temperature control process, a flow control process, etc.) is performing in terms of error from its setpoint. These processes can be examined by FDD layer 416 to expose when the system begins to degrade in performance and alert a user to repair the fault before it becomes more severe.

Modular Architecture

Figure 5:
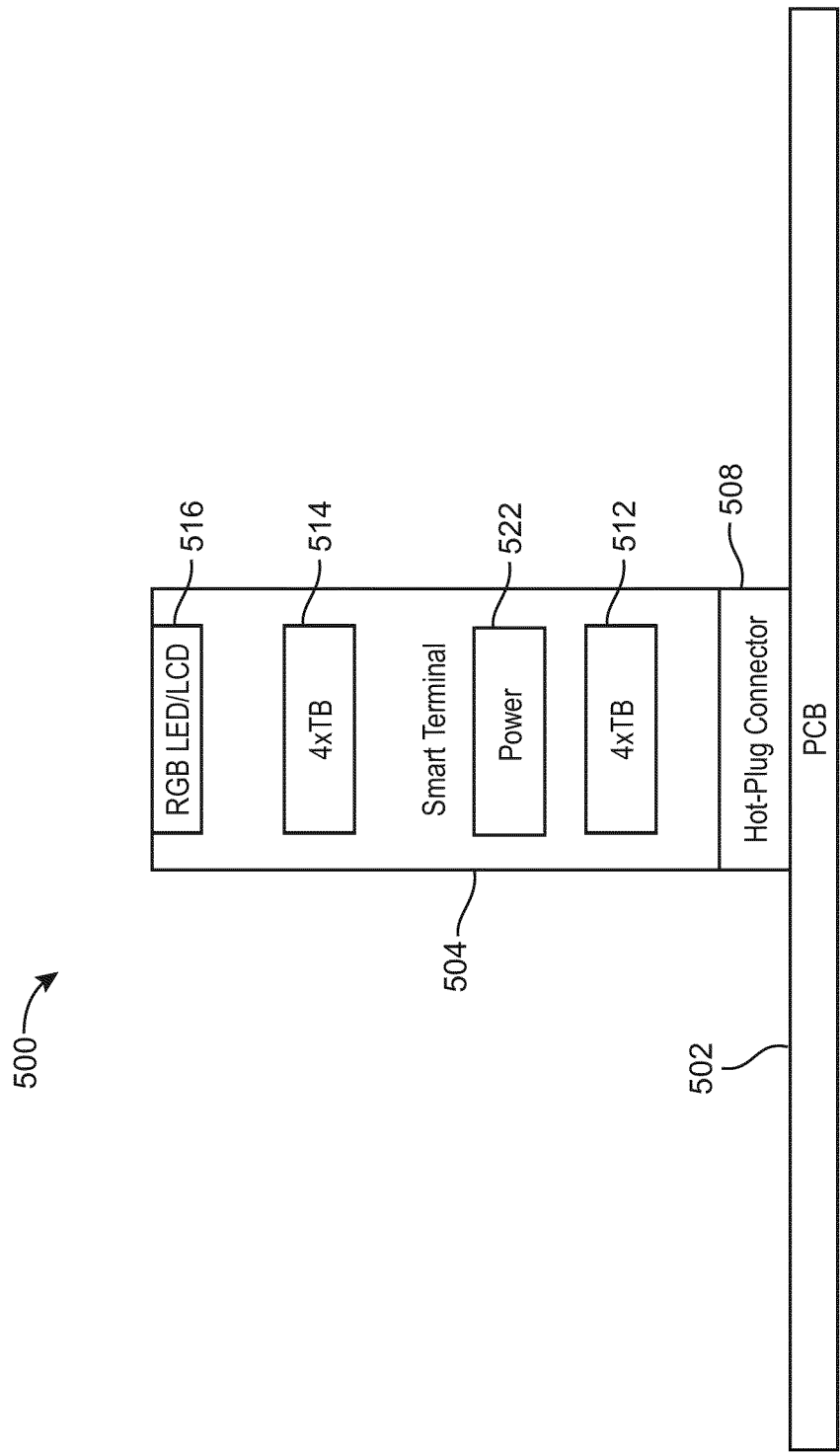
FIG. 5 is a block diagram of an example modular controller system provided on a printed circuit board associated with the BMS of FIG. 4, according to some embodiments.

Referring now to FIG. 5, a controller 500 for use in a BMS (e.g., BMS 10) is implemented using a modular architecture in some embodiments. Controller 500 can be controller 366 (FIG. 4) or any other type of controller in BMS 10. For example, controller 500 can be employed as a valve controller, a damper controller and AHU controller, an RTU controller, a thermostat, a fan speed controller, a compressor controller, combinations thereof, or any device for controlling equipment in BMS 10.

In some embodiments, controller 500 includes a mother board or printed circuit board 502 and at least one module 504. Module 504 is a smart device or smart terminal. In some embodiments a number of modules 504 can be housed on circuit board 502 or can be connected to each other in a horizontal or vertical outlay. Module 504 is configured as a smart module including processing and communication circuits in some embodiments. In some embodiments, module 504 has a housing the interfaces or integrates with the housing for board 502 when module 504 is plugged into connector 508 so that a unified housing is provided for controller 500. If module 504 is not provided, a blank or dummy housing component can be provided to protect the interface and to provide an integrated housing appearance.

Board 502 includes a processor, memory and components for performing generalized control and/or monitoring operations. Board 502 includes a connector 508 (e.g., a hot plug connector) for connecting to the module 504. Board 502 can include serial ports and communication interfaces for communication with various other devices, systems, and networks. Board 502 can house a microcontroller unit (MCU), a system on a chip (SOC), or generally any type of circuit such as an integrated circuit (IC), an application-specific integrated circuit (ASIC), a daughterboard, or a field-programmable gate array (FPGA). Board 502 may also be a larger device or may be a circuit or chip installed in or connected to a larger device. Further, board 502 may connect to existing devices such as a central processing unit (CPU) of a sensor or actuator or may replace processing circuits of existing devices. Connector 508 includes components on module 504 and board 502 for providing a physical or magnetic connection. Data and power communication occurs through connector 508 in some embodiments. Connector 508 is a hot plug connector in some embodiments.

Module 504 can house various hardware components and interfaces that may be provided with board 502. The components can include a wireless communications module, a wired communications module, a universal serial bus (USB) module, an RS-485 interface, a Bluetooth module, expandable input/output (I/O) points, and an expandable memory (e.g., SD-RAM). Other types of modular hardware components are possible and contemplated. Generally, module 504 allows controller 500 to be customized for a variety of different applications. Using fixed and/or modular hardware components, controller 500 can communicate with edge and legacy devices, cloud applications, external memory, and a Wi-Fi transceiver in some embodiments. Module 504 can be provided in its own housing and is mechanically keyed to properly interface with a housing of board 502 and to make a connection via connector 508.

In some embodiments, module 504 is a terminal device including terminal block 512, terminal block 514, and indicators 516. Indicators 516 can be a liquid crystal display (LCD), lamps, or an LED (red, green and blue) or other lights. In some embodiments, indicators 516 include a microphone, speaker or a buzzer for audio communication. Indicators 516 and terminal blocks 512 and 514 can be specific to certain applications, interfaces or protocols. In some embodiments, circuit board 502 communicates with terminal block 512 and 514 and indicators 516 via connector 508. Power for module 504 can be provided via the connector 508.

Terminal blocks 512 and 514 are mechanical connectors. In some embodiments, terminal blocks 512 and 514 have a specific configuration and number of connections for particular applications. Terminal blocks 512 and 514 can be modular insulated housing structures with terminals for receiving wires or connections having a variety of pitches and pole numbers. Terminal blocks 512 and 514 can be a printed circuit board mount, a barrier strip, a feed through terminal block, or other connective structure. In some embodiments, terminal blocks 512 and 514 provide different I/O types combined for modularity (e.g., UI—4-20 mA, 0-10V, RTD, dry contact BI and UO—AO (4-20 mA, 0-10V), BO (triac, FET), (SS) RO, wet contact BI). Terminal blocks 512 and 514 can each be a set of four terminal blocks including fixed points or input output interfaces for controller 500. Terminal blocks 512 and 514 can be configured to provide the appropriate interface for the signal types and shown in Table 1500 in FIG. 15 discussed in more detail below.

In some embodiments, module 504 includes a power circuit 522. Power circuit 522 operates as a power supply for module 504 and can include a battery. In some embodiments, power circuit 522 receives a power signal (120 VAC, 24 VAC, 5 VDC, etc.) from board 502 through hot plug connecter 508 and converts the power signal for power use by module 504 (5 VDC, 12 VDC, 12 VAC, etc.). Power circuit 522 can include transformers, diodes, voltage doublers, and other components for converting power signals. In some embodiments, power circuit 522 is a power over ethernet power supply and receives power from an ethernet connection associated with terminal bocks 512 and 514.

The board 502 can include a power circuit similar to power circuit 522 for providing appropriate power levels and types to components on board 502. In some embodiments, the power circuit on board 502 can also supply a variety of power levels and types to module 504. In some embodiments, module 504 is configured as a back-up power supply for controller 500 and any additional modules attached to board 502. In some embodiments, board 502 includes a back-up power supply including a rechargeable battery.

Figure 6:
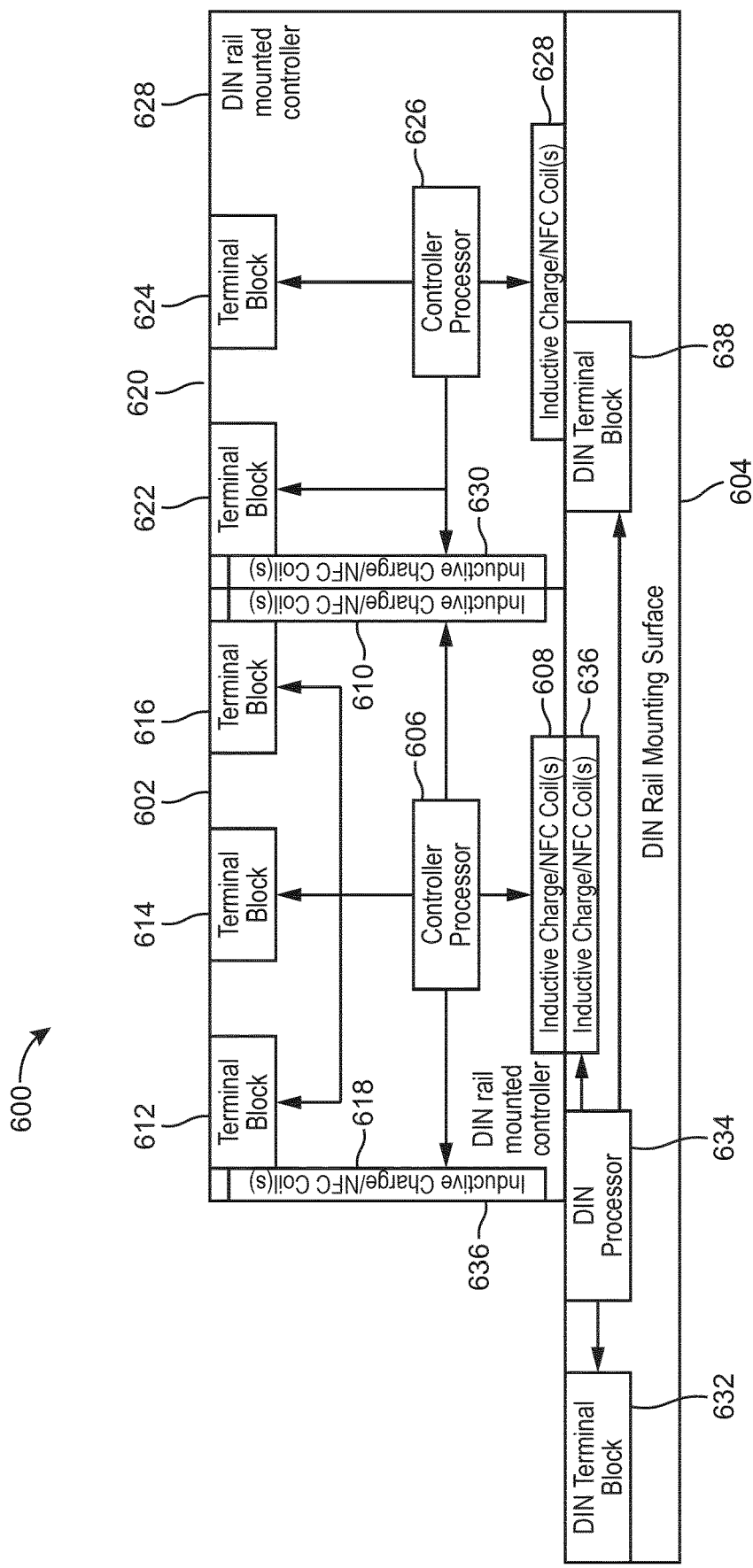
FIG. 6 is a block diagram of an example modular controller system provided on a Deutsches Institut für Normung (DIN) rail associated with the BMS of FIG. 4, according to some embodiments.

With reference to FIG. 6, a DIN-based control system 600 includes DIN rail 604 housing a DIN processor 634, a DIN terminal block 632, an inductive charge interface 636 (e.g., inductive, Bluetooth low energy (BLE), NFC coil-based, or other close proximity interface), and a DIN terminal block 638 according to some embodiments. DIN-based control system 600 also includes a module 602 embodied as a DIN rail mounted controller in some embodiments. In some embodiments, DIN-based control system 600 also includes one or more additional modules such as a module 620 embodied as a DIN rail mounted controller in some embodiments.

Module 602 includes a controller processor 606, an inductive charge interface 608 (e.g., inductive, BLE, NFC coil-based, or other close proximity interface), an inductive charge interface 610 (e.g., inductive, BLE, NFC coil-based, or other close proximity interface), an inductive charge interface 636 (e.g., inductive, BLE, NFC coil-based, or other close proximity interface), terminal block 612, terminal block 614, and terminal block 616. Module 602 is powered via interfaces 608 and 636. Module 602 can includes a rechargeable battery in some embodiments.

Terminal blocks 612, 614, and 616 can be coupled to external devices or module 620 and are similar to terminal blocks 512 and 514 (FIG. 5). Module 602 communicates with DIN processor 634 via interfaces 608 and 636 (e.g., via NFC). In some embodiments, one of terminal blocks 612, 614, and 616 can be coupled to terminal block 632 and 638 to connect controller processor 606 with DIN processor 634. Control system 600 may be the same as or similar to controller 500 as described above.

DIN rail 604 houses base hardware components (e.g., DIN processor 634, power busses, supporting hardware, etc.) and module 602 includes specialized or application specific features. The application specific features can include specific types of terminal blocks 612, 614, and 616 and specific types of software, firmware, displays, power circuits and processors, such as processor 606.

DIN rail can also be attached to module 620. Module 620 includes a controller processor 626, an inductive charge interface 628 (e.g., inductive, BLE, NFC coil-based, or other close proximity interface), an inductive charge interface 630 (e.g., inductive, BLE, NFC coil-based, or other close proximity interface), terminal block 622, and terminal block 624. Module 620 is powered via interfaces 630 communicating with interface 610 of module 602. Terminal blocks 622 and 624 can be coupled to external devices, terminal blocks 612, 614, and 616 of module 602, and terminal blocks 632 and 638 of DIN rail 604. Terminal blocks 622 and 624 are similar to terminal blocks 512 and 514 (FIG. 5). Module 620 communicates with DIN processor 634 via interfaces 608 and 636 (e.g., via NFC) and interfaces 610 and 630 in some embodiments. In some embodiments, one of terminal blocks 622 and 624 can be coupled to terminal block 632 and 638 to connect controller processor 606 with DIN processor 634.

Control system 600 may also include any of a variety of modular hardware components similar to modules 602 and 620 that can be connected to DIN rail 604 or modules 602 and 620 if needed for a given application. For example, modules 602 and 620 can be designed such that a Wi-Fi module can be connected if a customer desires Wi-Fi communication capabilities. However, if the customer does not need Wi-Fi functionality, then the customer can purchase module 602 or 620 without WiFi, thereby saving cost. Modules 602 and 620 can be designed to have a specific number and type of terminal block for a customer's specific application. Control system 600 may communicate with building equipment in a BMS such as described herein using hardware components on DIN rail 604, modular hardware components on modules 602 and 620, or any combination thereof.

Terminal blocks 612, 614, 616, 622, 620, 632, and 638 can support power connections, serial ports, BACnet/MSTP interfaces, a BACnet/IP interfaces, ethernet ports, USB ports, analog ports, and general purpose input/output (GPIO) points in some embodiments. It should be noted that fixed hardware components as shown in FIG. 6 are an example. Control system 600 may be provided with different fixed hardware components than shown in FIG. 6. It will be appreciated that control system 600 can be provided with more, less, or different expandable options other than shown in FIG. 6. Terminal blocks 612, 614, 616, 622, 620, 632, and 638 can be configured to provide the appropriate interface for the signal types and shown in Table 1500 in FIG. 15 discussed in more detail below.

Serial ports on terminal blocks 612, 614, 616, 622, 620, 632, and 638 may provide a serial connection between control system 600 and building equipment such as sensors and actuators. For example, an actuator such as actuator 354 (FIG. 3) may have a serial interface through which it can connect to control system 600 through serial ports. Serial ports may be designed for use with RS-232 standard, RS-422 standard, RS-485 standard, I2C standard, USB standard, or any other type of serial communications. Serial ports may be male or female connectors with any number of pins. Moreover, it will be appreciated that fixed hardware components on terminal blocks 612, 614, 616, 622, 620, 632, and 638 may also include parallel ports instead of or in addition to serial ports.

Terminal blocks 612, 614, 616, 622, 620, 632, and 638 can provide a BACnet/MSTP hardware interface between control system 600 and a BACnet Master-Slave Token Passing communications bus such as a Sensor Actuator (SA) bus. BACnet/MSTP interface can provide a serial connection to such a bus based on RS-485 standard. BACnet/IP interface may be hardware that provides an interface between a control device and a BACnet/IP network. BACnet/IP interface may provide a wired or wireless connection to a BACnet/IP network. In some embodiments, fixed hardware 640 can provide an interface for connecting control device to a BACnet router or other type of router.

Terminal blocks 612, 614, 616, 622, 620, 632, and 638 can also be configured to provide general purpose input/output points for uncommitted signal pins provided with base hardware components. These inputs and outputs can be used for a variety of different purposes depending on the application of control device. For example, I/O points can receive inputs from sensors such as temperature sensors, flow sensors, pressure sensors, air quality sensors, occupancy sensors, and other types of sensors. I/O points can also receive inputs from and provide output to equipment such as valves and actuators in addition to other BMS devices such as described above. Points can be used to provide outputs such as control signals (e.g., setpoints), commands, requests for data, and the like.

Processors 606, 634, and 626 may be any type of processor such as a central processing unit (CPU). It will be appreciated that processors 606, 634, and 626 may have one or more processing cores. A memory of any type and size can be provided such as random access memory (RAM), flash memory, read-only memory (ROM), or any combination thereof. Processors 606, 634, and 626 and the memory generally allow control system 600 to perform more advanced functions than otherwise possible with more minimal hardware that may be provided with edge devices such as sensors and actuators.

Any of modules 602 and 620 can be provided with DIN rail 604 to provide control system 600 with additional functionality. Modules 602 and 620 can be connected to base DIN rail 604 at the time of manufacturing or can be connected to after manufacturing. Additional modules similar to modules can be attached to DIN rail 604 and communicate with processor 634 and modules 602 and 620. The additional modules can be attached at terminal blocks 612, 614, 616, 622, and 624 and be physically separate from DIN rail 604 in some embodiments. The additional modules can be physically attached to modules 602 and 620 and separate from DIN rail 604.

Modules 602 and 620 may include a variety of other types of components other than described above. For example, these other components may provide a connections between control system 600 and a Modbus network, a Lon Talk network, a KNX network, a Z-Wave network, a ZigBee network, and other similar networks. The other components may also include a power over Ethernet (PoE) powered device (PD) or power sourcing equipment (PSE) module, a cellular module and a near field communications (NFC) module. The other components may generally include a variety of different wireless communications modules and wired communication modules in addition to analog-to-digital converters (ADC) and digital-to-analog converters (DAC). The other components may also include various different types of ports in addition to expandable or flexible I/O points and increased processing power. It will be appreciated that a variety of different modules 602 and 620 can be provided consistent with the modular architecture described herein.

Figure 7:
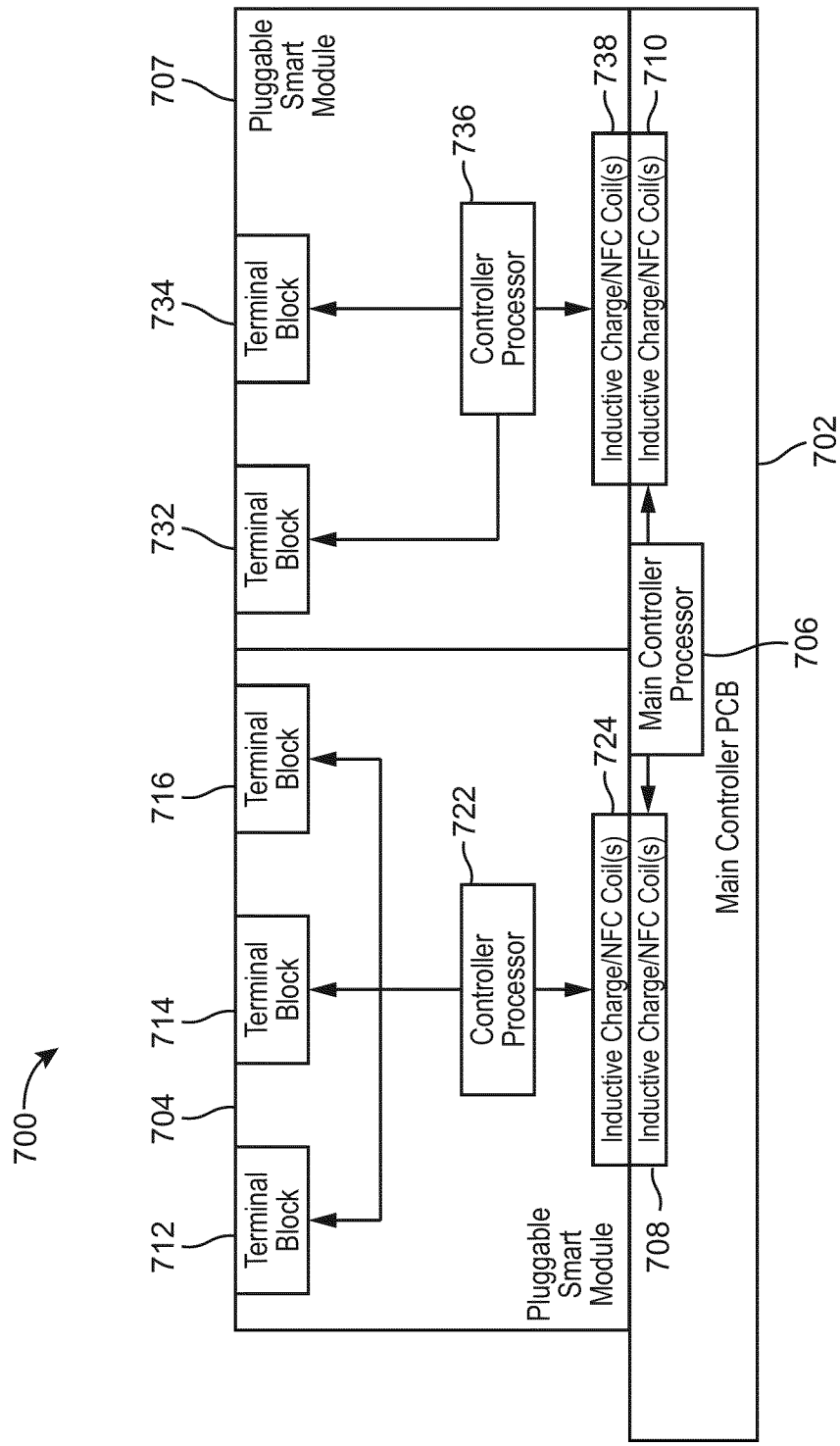
FIG. 7 is a block diagram of an example modular controller system provided on a main controller printed circuit board associated with the BMS of FIG. 4, according to some embodiments.
Figure 8:
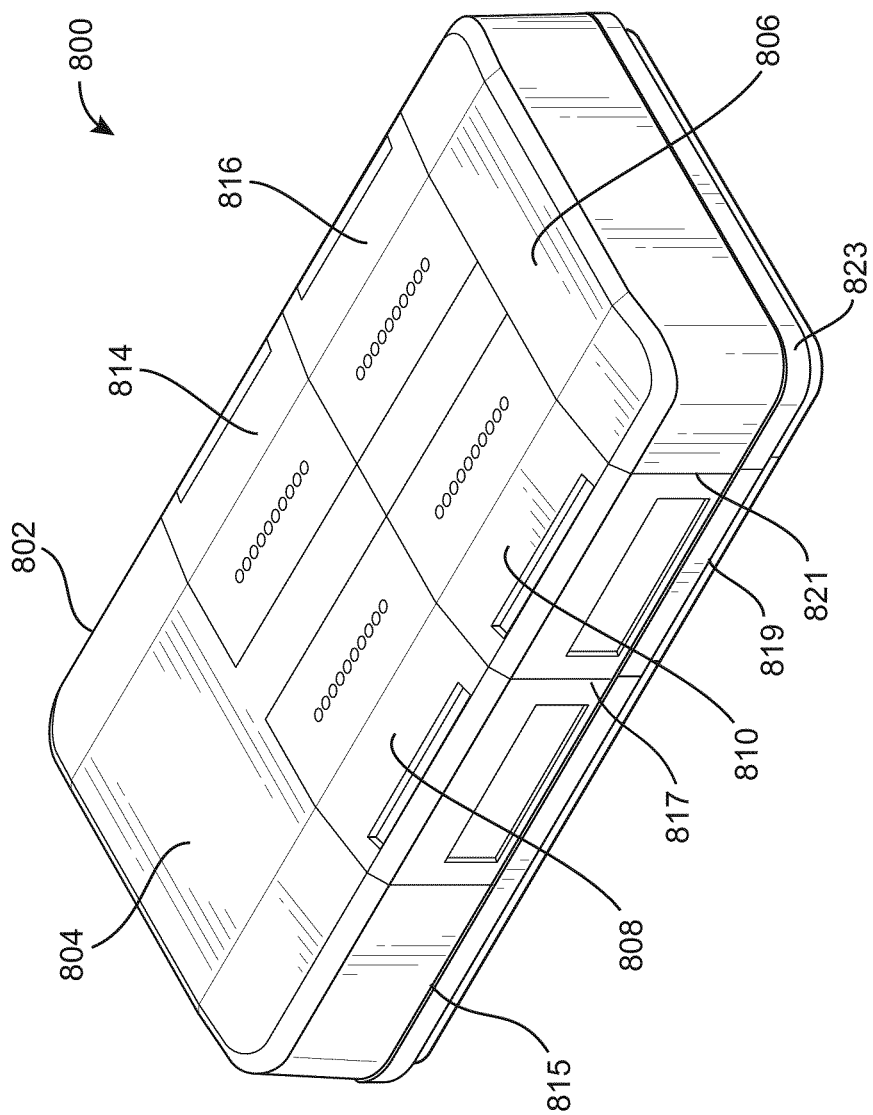
FIG. 8 is an isometric view schematic drawing of an exemplary controller system associated with the BMS of FIG. 4, according to some embodiments.

With reference to FIG. 7, a controller 700 for use in a BMS (e.g., BMS 10, FIG. 1) is implemented using a modular architecture in some embodiments. In some embodiments, controller 700 includes a mother board or printed circuit board 702 and at least one module 704. Module 704 is a pluggable smart device or smart terminal. In some embodiments a number of modules 704 can be housed on circuit board 702 or can be connected to each other in a horizontal or vertical outlay. Module 704 is configured as a smart module including processing and communication circuits and includes its own housing in some embodiments.

Board 702 includes a main controller processor 706 for implementing and monitoring main controller functions and can be configured as one or more processors, memories and components for performing generalized control and/or monitoring operations. Processor 706 can be a microcontroller unit (MCU), a system on a chip (SOC), or generally any type of circuit such as an integrated circuit (IC), an application-specific integrated circuit (ASIC), a daughter-board, or a field-programmable gate array (FPGA). Board 702 is provided in its own housing and includes a slot or interface for receiving module 704 in some embodiments.

Board 702 may also be a larger device or may be a circuit or chip installed in or connected to a larger device. Board 702 includes a hot plug connector or an inductive charge interface 708 (e.g., inductive, BLE, NFC coil-based, or other close proximity interface) for connecting to the module 704. Board 702 also includes a hot plug connector or an inductive charge interface 710 (e.g., inductive, BLE, NFC coil-based, or other close proximity interface) for connecting to a module 707. Interfaces 708 and 710 can be used to provide power and for communication. Board 702 can include serial ports and communication interfaces for communication with various other devices, systems, and networks. Further, board 702 may connect to existing devices such as a central processing unit (CPU) of a sensor or actuator or may replace processing circuits of existing devices.

Module 704 can house various hardware components and interfaces that may be provided with board 702. The components can include a wireless communications module, a wired communications module, a universal serial bus (USB) module, an RS-485 interface, a Bluetooth module, expandable input/output (I/O) points, and an expandable memory (e.g., SD-RAM). Other types of modular hardware components are possible and contemplated. Generally, module 704 allows controller 700 to be customized for a variety of different applications. By means of fixed and/or modular hardware components, controller 700 can communicate with edge and legacy devices, cloud applications, external memory, and a Wi-Fi transceiver to name some examples. Modules 704 and 707 can be provided in their own housing and be mechanically keyed to properly interface with a housing of board 702 and to make a connection via interfaces 708 and 710.

In some embodiments, module 704 is a terminal device including terminal block 712, terminal block 714, and terminal block 716. Terminal blocks 714, 716, and 718 can be specific to certain applications, interfaces or protocols. In some embodiments, circuit board 702 communicates with terminal block 712, 714, and 518 and indicators 516 via interface 708. Power for module 704 can be provided via interface 708. Terminal blocks 712 and 714, and 716 are similar to terminal blocks 512 and 514 (FIG. 5). Terminal blocks 712 and 714, and 716 can be configured to provide the appropriate interface for the signal types and shown in Table 1500 in FIG. 15 discussed in more detail below.

Module 707 is similar to module 704 and includes a controller processor 736, an inductive charge interface 738 (e.g., inductive, BLE, NFC coil-based, or other close proximity interface), terminal block 732, and terminal block 734. Module 707 is powered via interface 738 communicating with interface 710 of board 702. Terminal blocks 732 and 734 can be coupled to external devices, and/or terminal blocks 712, 714, and 716 of module 704. Terminal blocks 732 and 734 are similar to terminal blocks 512 and 514 (FIG. 5). Module 707 communicates with processor 706 via interfaces 738 and 710 (e.g., via NFC or BLE) in some embodiments. In some embodiments, module 707 communicates with processor 722 via interfaces 708, 724, 738 and 710 (e.g., via NFC) in some embodiments.

The architectural design of controllers 500 and 700 and control system 600 allows customers to select only hardware components desired for a specific application without forcing customers to purchase hardware that is not necessary in some embodiments. Moreover, customers can remove any of modules 504, 602, 620, 704, and 707 if desired. The modular design also allows customers to easily replace a failed component in the field instead of removing the component for servicing or purchasing an entirely new part in some embodiments. In some embodiments, a processor board might have inadequate millions of instructions per second (MIPS) or memory capability and could be replaced with a faster processor or one with more memory. The existing modules 504, 602, 620, 704, and 707 could remain intact, potentially saving wiring and commissioning time and cost, in addition to saving cost associated with preserving the existing boards in the system.

In some embodiments, modules 504, 602, 620, 704, and 707 allows dynamic factory and field configuration of point counts and types. The modules 504, 602, 620, 704, and 707 are hot-pluggable/swappable and are automatically identified/addressed by the main processor (e.g., by processors 634 and 706 using multi-master with address arbitration) or manually addressed via switches or NFC. In some embodiments, each of modules 504, 602, 620, 704, and 707 is serialized and has a unique address (e.g., processor or EEPROM on an internal serial bus with unique identifier), which is readable by the processor to determine the I/O point mix that is installed in the overall system. In some embodiments addressing is accomplished by use of a split serial bus. In some embodiments, only one processor board is used in controllers 500 and 700 and control system 600, and all I/O modules 504, 602, 620, 704, and 707 pass a serial signal through a processor onto the next of modules 504, 602, 620, 704, and 707.

An independent data signal, electrically shared by all modules 504, 602, 620, 704, and 707 is used to communicate with the processor board (e.g., boards 502 and 702 or DIN processor 634) in some embodiments. In the addressing sequence, the serial signal would communicate from the processor to a first module of modules 504, 602, 620, 704, and 707. The first module would receive commands on the serial signal and respond on the shared data signal. After establishing a unique address identifier with the processor board (e.g., board 502 or 702), the first module acts as a serial pass-through to send address arbitration signaling to the second module, not replying on the shared data signal. This process is carried on, until no response is received on the data line after querying all installed modules 504, 602, 620, 704, and 707. This addressing process occurs at each power-up sequence in some embodiments.

Indicators 516 provide a user indication of status and/or terminal position and can also be provided on modules 602, 620, 704, and 707. Indications are used for fault and/or I/O status (i.e. wiring fault, out-of-range input, active output, etc.) in some embodiments. Each modules 504, 602, 620, 704, and 707 is self-encapsulated for environmental protection and safe handling in the field in some embodiments. In addition, the connections between modules 504, 602, 620, 704, and 707 and circuit boards 502 and 702 and DIN rail 604 can be keyed (disallowed in certain positions) and/or physically secured with additional hardware for a robust design.

Interfaces 708, 724, 710, and 738 provide galvanic isolation by way of an air gap, necessary for some input/output (I/O) types/applications in some embodiments. An encoded data transmission, superimposed on the inductive charging scheme, provides inter-module and inter-controller communications in close proximity (e.g., for modules 504, 602, 620, 704, and 707 plugged into controller and/or between modules 602 and 620 on DIN rail 604 or other configuration) in some embodiments. A separate close-proximity wireless technology (i.e. NFC, BLE, etc.) is used in tandem to the inductive coupling/"charging" if applicable (i.e. more bandwidth, etc.) in some embodiments. Using wireless power and communication transmission schemes allows for mounting options, such as a strong captive magnetic pairing between modules 504, 602, 620, 704, and 707 and backplanes, etc. In some embodiments, DIN rail 604 acts as one half of the inductive coupling mechanism and power and/or communications could be used via a DIN rail inductive backplane.

With reference to FIGS. 8-13, a controller 800 similar to controllers 500 and 700 and control system 600, includes a housing 802. Housing 802 includes a main portion 804, and an end portion 806. Modules 808, 810, 814, and 816 fit with housing 802. Modules 808, 810, 814, and 816 are similar to modules 504, 602, 620, 704, and 707 (FIGS. 5-7). Main portion 804 can be associated with a mother board or main board similar to boards 502 and 702 (FIGS. 5 and 7).

Interfaces can be provide on a top surface of modules 808, 810, 814, and 816 to receive additional modules vertically. The interfaces can be magnetic or inductive interfaces or be physical connector interfaces or combinations thereof. In some embodiments, housing 802 includes a floor 815 (FIG. 8) that extends from underneath portion 804 and modules 808 and 814 past an edge 817 between modules 810 and 808. Floor 815 snap fits into floor 819 under most of modules 810 and 816 to past an edge 821 of end portion 807. End portion 806 is disposed above a floor 823 which snap fits into floor 819.

Figure 12:
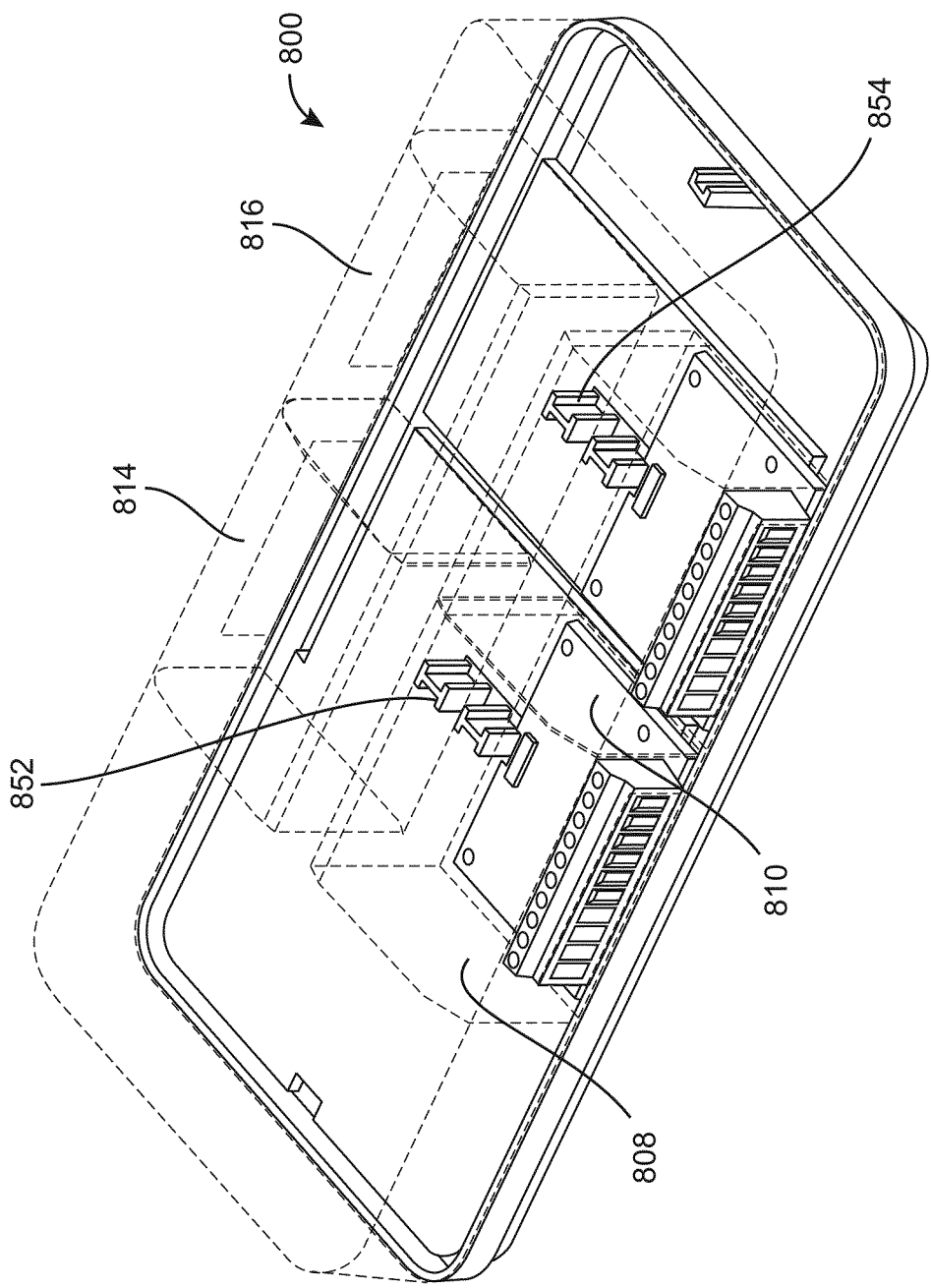
FIG. 12 is an isometric view schematic drawing with transparency of the exemplary controller system illustrated in FIG. 8.

Modules 814 and 816 include terminal blocks 832 and 834 (FIG. 11) which can be similar to blocks 712, 712 and 716 (FIG. 7). Terminal blocks 832 and 834 are screw type terminal blocks in some embodiments. Modules 808 and 810 do not include terminal blocks on a top surface and have interfaces 840 and 842 (FIG. 10) in some embodiments. Modules 814 and 816 are connected to modules 808 and 810, respectively, via connectors or interfaces 852 and 854 (FIG. 12). Interfaces 852 and 854 are similar to interfaces 724 and 738 or are hardware connectors (e.g., ribbon connectors, etc.).

Figure 13:
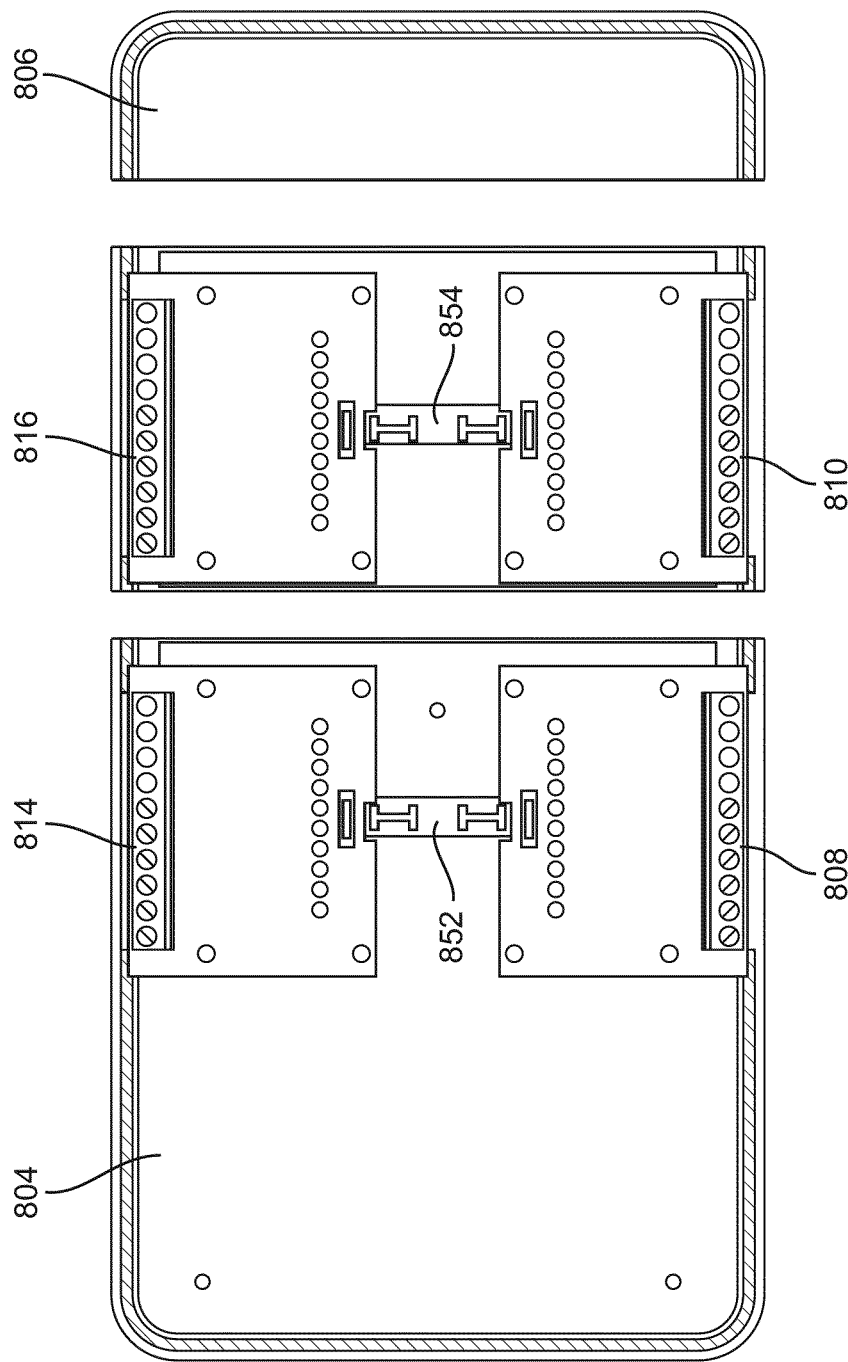
FIG. 13 is an exploded top planar view schematic drawing of the exemplary controller system illustrated in FIG. 8 showing modular sections, according to some embodiments.
Figure 14:
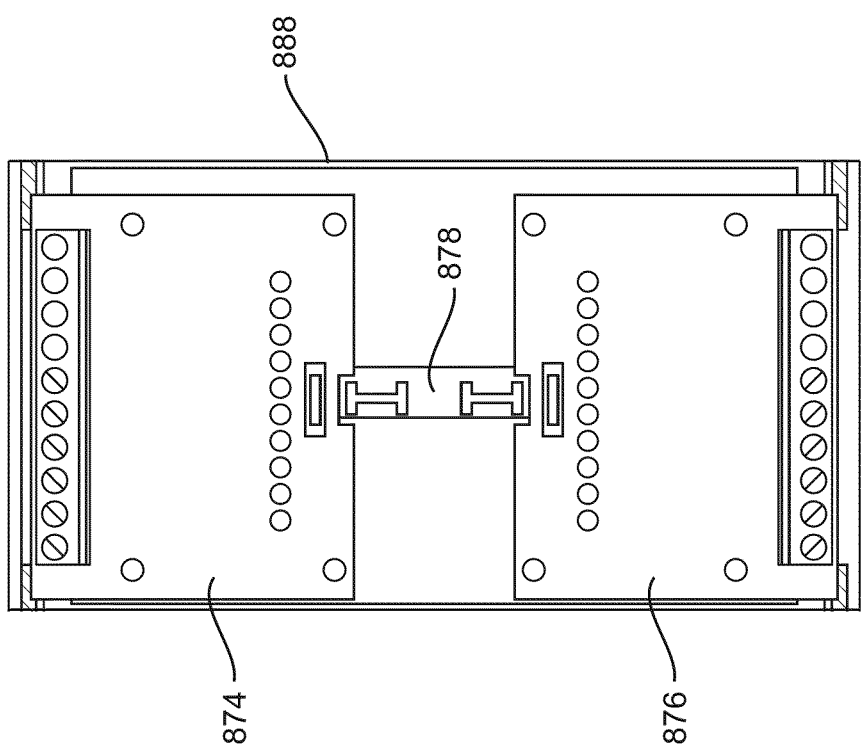
FIG. 14 is a top planar view schematic drawing of an add-on module for the exemplary controller system illustrated in FIG. 8, according to some embodiments.

In some embodiments, end portion 806 of housing 802 is removed as shown in FIG. 13 so that modules 874 and 787 (FIG. 14) can be attached. Modules 874 and 876 can be coupled by an interface 878. End portion 806 can be attached to modules 874 and 876 at a side 888. Modules 808, 810, 814, 816, 874, and 876 can electrically and mechanically couple to a base circuit board associated with housing 802. Fasteners, snap fits, clips, straps, brackets, latches, etc. can be used to secure modules 808, 810, 814, 816, 874, and 876 to the base circuit board or housing 802. Other fastening techniques can be utilized. The housing of portion 804, end portion 806 and modules 808, 810, 814, 816, 874, and 876 appear as a unitary housing when connected together.

In some embodiments, modules 808, 810, 814, 816, 874, and 876 include a power circuit similar to power circuit 522 (FIG. 5). The power circuits of modules 808, 810, 814, 816, 874, and 876 receives a power signal (120 VAC, 24 VAC, 5 VDC, etc.) from a base circuit board associated with housing 802 and converts the power signal to a 5 VDC, 12 VDC, 12 VAC, etc. signal. The power circuit can include rechargeable batteries, transformers, diodes, voltage doublers, and other components for converting and providing power signals. In some embodiments, power circuit is a power over ethernet power supply and receives power from an ethernet connection.

With reference to FIG. 15, modules 808, 810, 814, 816, 874, and 876 can be configured for various point types including but not limited to a universal input (UI), a binary input (BI), an analog output (AO), a binary output (BO), a universal output (UO), configurable output (CO), a relay output, and combinations thereof as shown in Table 1500. Point types used by controller model numbers MS-IOM-1711, MS-IOM-2711, MS-IOM-3711, and MS-IOM-4711 manufactured for Johnson Controls International as shown in Table 1500 can be achieved by selecting modules 808, 810, 814, 816, 874, and 876 with the appropriate terminal blocks. In some embodiments, the UI accepts an analog input, voltage mode 0-10 VDC signal, an analog input, current mode 4-20 ma signal, an analog input, resistive mode 0-2 Kilo Ohm signal (e.g., for Resistance Temperature Detector (RTD)), and a binary input, dry contact maintained mode signal. In some embodiments, the BI accepts a pulse counter mode (high speed), 100 Hz signal and a binary input, dry contact maintained mode signal. In some embodiments, the AO provides an analog output, voltage mode 0-10 VDC signal, and an analog output, current mode 4-20 ma signal. In some embodiments, the BO provides a 24 VAC triac signal. In some embodiments, the UO provides an analog output, voltage mode 0-10 VDC signal, an analog output, current mode 4-20 ma signal, and a binary output mode, 24 V AC/DC FET signal. In some embodiments, the CO provides a 24 VAC triac signal. In some embodiments, the UO provides an analog output, voltage mode 0-10 VDC signal, and a binary output mode, 24 VAC triac signal. In some embodiments, the relay output provides 120/240 VAC signal. Additional point types and combinations which are not listed in Table 1500 can also be utilized.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A controller device in a building system, the device comprising:
   a base comprising a first processor and a base interface, the first processor being configured to provide control operations in the building system; and
   a first module installable on and removable from the base, the first module comprising first module interface for receiving power from and communicating with the base via the base interface and a terminal block; and
   a second module installable on and removable from the base, the second module comprising a second module interface for receiving power from and communicating with the first module, wherein the first module acts as a serial pass-through to send address arbitration signaling to the second module.

2. The device of claim 1, further comprising:
   a third module installable on and removable from the base, the third module comprising a third module interface for receiving power from and communicating with the base via the base interface and another terminal block.

3. The device of claim 1, wherein the second module is stacked vertically with respect to the first module, wherein a vertical direction is at a 90 degree angle with respect to a main plain of the base.

4. The device of claim 1, wherein the first module comprises a second processor for performing a wireless communications, or a wired communications via the terminal block.

5. The device of claim 1, wherein the first and second module comprise terminal blocks.

6. The device of claim 5, wherein the second module comprises a plurality of terminal blocks.

7. The device of claim 5, wherein the second module interface is an inductive interface.

8. The device of claim 1, wherein the first module is magnetically connected to the base.

9. A building system, comprising:
   equipment that affects or senses an environment within a building;
   a controller device comprising:
     a base comprising a first processor and a base interface, the first processor being configured to provide control operations for a device in the building system; and
     a first module installable on and removable from the base, the first module comprising a second processor and a first module interface for receiving power from and communicating with the base via the base interface, wherein the first processor queries an address from the second processor of the first module at power up; and
     a second module installable on and removable from the base, the second module comprising a third processor and a second module interface for receiving power from and communicating with the first module via the first module interface, wherein the first module acts as a serial pass-through to send address arbitration signaling to the second module.

10. The system of claim 1, wherein the second module interface is configured for receiving the power from and communicating with the first module via the first module interface.

11. The system of claim 10, wherein the first and second module comprise terminal blocks.

12. The system of claim 10, wherein the first and second module comprise terminal blocks and indicators, the indicators indicating an input output (I/O) status of the first and second module.

13. The system of claim 9, wherein the first module is attached to a DIN rail.

14. The system of claim 9, wherein the second module is stacked vertically on top of the first module, wherein a vertical direction is at a 90 degree angle with respect to a main plain of the base.

15. A method for monitoring or controlling a device in a building management system (BMS), the method comprising:
   providing a base comprising a first processor and a wireless base interface, the first processor being configured to provide control operations for a device in the BMS;
   installing a first module installable on the base, the first module comprising a terminal block and a first wireless module interface for receiving power from and communicating with the base via the wireless base interface;
   installing a second module installable on the base, the second module comprising a second module interface for receiving power from and communicating with the first module, wherein the first module acts as a serial pass-through to send address arbitration signaling to the second module and
   coupling the device to the terminal block.

16. The method of claim 15, wherein the first and second module comprise terminal blocks.

17. The method of claim 15, wherein the wireless base interface provides a magnetic bond to the first wireless module interface.

18. The method of claim 15, wherein the device comprises an actuator.

19. The method of claim 15, wherein the first module controls a fan.

20. A controller device in a building system, the device comprising:
   a base comprising a first processor and a base interface, the first processor being configured to provide control operations for a device in the building system, wherein the base interface is configured to receive a first plug-in module and comprises a power and communication interface for providing power to and communicating with the plug-in module and wherein the base interface is configured to receive a second module installable on and removable from the base, the second module comprising a second module interface for receiving power from and communicating with the first module, wherein the first module acts as a serial pass-through to send address arbitration signaling to the second module.

* * * * *